United States Patent [19]
Culbertson et al.

[11] Patent Number: 5,790,771
[45] Date of Patent: Aug. 4, 1998

[54] APPARATUS AND METHOD FOR CONFIGURING A RECONFIGURABLE ELECTRONIC SYSTEM HAVING DEFECTIVE RESOURCES

[75] Inventors: W. Bruce Culbertson; Philip J. Kuekes, both of Palo Alto, Calif.

[73] Assignee: Hewlett-Packard Company, Palo Alto, Calif.

[21] Appl. No.: 641,467

[22] Filed: May 1, 1996

[51] Int. Cl.$^6$ .................................................. G06F 11/00
[52] U.S. Cl. .................................................. 395/182.01
[58] Field of Search ........................... 395/182.01, 183.01, 395/183.09, 183.13, 653; 364/148, 149, 150, 468.03, 578, 965; 370/244

[56] References Cited

U.S. PATENT DOCUMENTS

| | | | |
|---|---|---|---|
| 4,873,687 | 10/1989 | Breu | 371/8.2 |
| 5,425,036 | 6/1995 | Liu et al. | 371/23 |
| 5,452,227 | 9/1995 | Kelsey et al. | 364/489 |
| 5,493,507 | 2/1996 | Shinde et al. | 364/489 |
| 5,541,862 | 7/1996 | Bright et al. | 364/580 |
| 5,568,491 | 10/1996 | Beal et al. | 371/30 |
| 5,598,344 | 1/1997 | Dangelo et al. | 364/489 |
| 5,604,888 | 2/1997 | Kiani-Shabestari et al. | 395/500 |
| 5,633,813 | 5/1997 | Srinivasan | 364/578 |
| 5,650,938 | 7/1997 | Bootehsaz et al. | 364/490 |

OTHER PUBLICATIONS

Wang et al., "Computer–Aided Modeling & Evaluation of Reconfigurable VLSI Processor Arrays with VHDL", IEEE Trans on Computer–Aided Design, vol. 11, No. 2, Feb. 1992, pp. 185–197.

Wang et al., "Design for Diagnosability & Diagnostic Strategies of WSI Array Architectures"IEEE, Jan. 1994, pp. 208–217.

Wang et al., "Integrated Diagnosis & Reconfiguration Process for Defect Tolerant WSI Processor Arrays", IEEE Proceed. on Wafer Scale Integration, Jan. 1994, pp. 198–207.

Kelly et al., "Defect Tolerant SRAM Based FPGAs", 1994, pp. 479–482, IEEE.

Howard et al. "The Yield Enhancement of Field–Programmable Gate Arrays", 1994, vol. 2 (1), pp. 115–123, IEEE Transactions on Very Large Scale Integration (VLSI) Systems.

Johnson et al., "General–Purpose Systolic Arrays", 1993 pp. 20–31, IEEE.

Walker, "Tolerance of Delay Faults", 1992, pp. 207–214, International Workshop on Defect and Fault Tolerance in VLSI Systems IEEE.

McCluskey, "Logic Design Principles", 1986, pp. 465–469, Prentice–Hall.

*Primary Examiner*—Robert W. Beausoliel, Jr.
*Assistant Examiner*—Stephen C. Elmore
*Attorney, Agent, or Firm*—Thomas X. Li

[57] ABSTRACT

An arrangement for configuring a reconfigurable system having a plurality of resources includes a compiler that configures the resources to implement a functional system in accordance with a user design. A defect database is also provided that (1) stores information indicating which of the resources is defective when the resources contain at least one defective resource, and (2) supplies the information to the compiler such that the compiler does not use the defective resource when the compiler configures the resources to implement the user design. The arrangement also includes a detection subsystem that repeatedly and redundantly tests operational condition of the resources grouped in different groups to detect the defective resources.

19 Claims, 22 Drawing Sheets

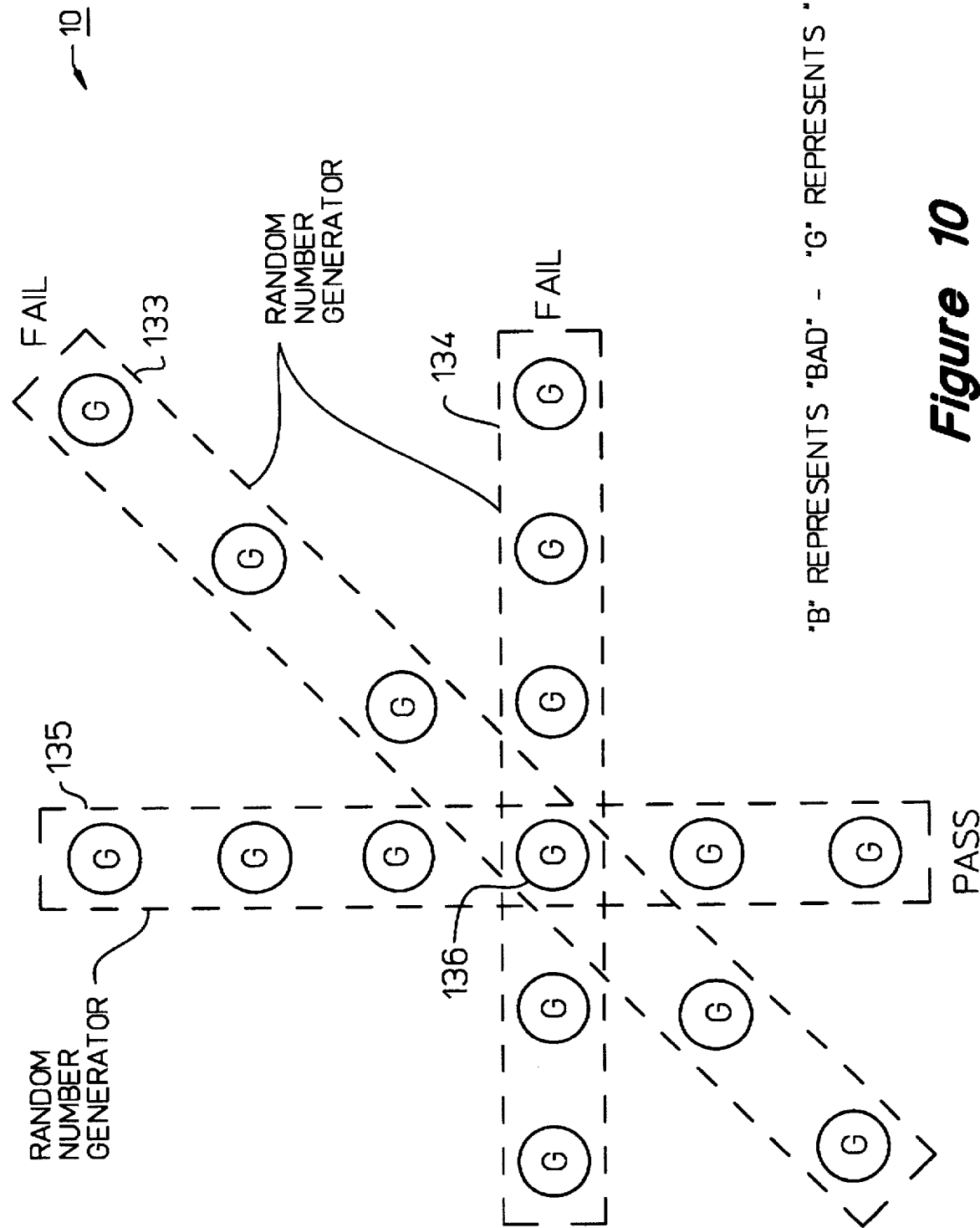

APPARATUS AND METHOD FOR CONFIGURING A RECONFIGURABLE ELECTRONIC SYSTEM HAVING DEFECTIVE RESOURCES

BACKGROUND OF THE INVENTION

1. Field of the Invention

The present invention pertains to reconfigurable systems. More particularly, this invention relates to configuring a reconfigurable system having defective resources to obtain the correct operation of the system in spite of the defective resources in the system.

2. Description of the Related Art

A reconfigurable system typically refers to digital hardware having a relatively large number of programmable wire intercomiections and/or gates. These programmable wire interconnections and gates are collectively referred to as resources below. The reconfiglurable system can be programmed and reprogrammed to implement various logic designs. Examples of such reconfigurable systems are field programmable gate arrays (FPGAs), crossbar switches, and systems having FPGAs and/or crossbar switches.

Because of their reprogranunable nature, the reconfigurable systems can be used to design and test (i.e., prototype) logic devices. This allows the designer or manufacturer of the logic devices to find out if the logic design of a desired logic device contains any mistake without actually building the desired logic device. In addition, this allows changes in the logic design to be made relatively easily and conveniently during the design process. Once the logic design implemented in a reconfigurable system is completed and tested, if the manufacturer desires to produce the logic device in large quantities, the prototyped logic design can then be converted into an actual circuit layout to mass produce the logic device.

As the technology of fabricating semiconductor integrated circuit advances, the integration density of the reconfigurable logic system increases accordingly. In addition, the integration density of a reconfigurable logic system can be further increased by combining multiple FPGA chips to form a multi-chip module (MCM). Use of large scale integrated circuits in a reconfigurable logic system typically produces various advantages such as the enhancement of the function of the reconfigurable system and the reduction in the size and weight thereof However, disadvantages are also associated with the use of the large scale integrated circuits in a reconfigurable system. One disadvantage is that the large scale integration typically makes the reconfigurable system prone to defects during fabrication, thus increasing the manufacturing cost of the system. Although large and reliable systems can be manufactured by imposing extreme quality control measures and manufacturing tolerances, these measures greatly increase the manufacturing cost of the systems. On the other hand, if a device or system is found to include a defective element that cannot be repaired or replaced, the device typically becomes non-functional and must be rejected although the vast majority of elements are non-defective. This also increases the manufacturing cost of the device because it reduces the yield of the device.

One reason that the prior reconfigurable systems do not allow defects is that it is typically extremely difficult and costly to detect and locate defects in a large reconfigurable logic system to small circuit elements such as gates, wires, transistors, and crossbar switches although the reconfigurable logic system can be configured in many different ways to implement a given logic design (i.e., user design) so as to avoid all the defects in the system. This is because it is typically not possible to test arbitrary points inside an integrated circuit. The prior testing techniques for conventional digital systems only locate defects to the level of an integrated circuit chip or a replaceable unit or block within an integrated circuit. They typically are not able to locate the defects to small structures or circuit elements such as gates, wires, transistors, and crossbar switches. In addition, a test of one resource of the reconfigurable system typically requires other resources of the reconfigurable system that are known to be good or non-defective.

Thus, it is desirable to identify and avoid all of the defects of a reconfigurable logic system (i.e., to provide a defect-tolerant reconfigurable system) when configuring the reconfigurable system to implement a user design. In addition, it is also desirable to allow detection of the defects to small structures or circuit elements in the reconfigurable system in an efficient and cost-effective manner such that the reconfigurable system can be used as a defect-tolerant reconfigurable system.

SUMMARY OF THE INVENTION

One of the features of the present invention is to provide a defect-tolerant reconfigurable system, thus reducing the fabrication cost of the system.

Another feature of the present invention is to allow configuration of a reconfigurable system having defects without replacing, repairing, or removing the defects from the system.

A further feature of the present invention is to precisely locate a defect to a small circuit structure in a reconfigurable system to maximize the number of good circuit structures that can be used.

A still further feature of the present invention is to locate a defect in a reconfigurable system in an efficient and cost-effective manner.

Described below is an arrangement for configuring a reconfigurable system having a plurality of resources. The arrangement includes a compiler that configures the resources to implement a functional system in accordance with a user design. A defect database is also provided that (1) stores information indicating which of the resources is defective when the resources contain at least one defective resource, and (2) supplies the information to the compiler such that the compiler does not use the defective resource when the compiler configures the resources to implement the functional system.

In addition, a defect detection arrangement is provided to detect the defective resources among all the resources. The detection arrangement configures the resources into a number of test systems, each having a number of resources. The detection arrangement then tests and determines if each of the test systems is operational. Each resource within each of the operational test systems is then identified as non-defective. The detection arrangement then reconfigures the resources into a number of different test systems (i.e., combining different groups of resources into test systems each time) and repeats the process until substantially every one of the resources except the defective resource has been identified as non-defective.

If a test system is tested to be non-operational, then none of the resources within the test system is marked or identified as non-defective (i.e., good). Those resources remain in the assumed defective state or unknown state.

3

Because of the redundant testing, it is possible for some test groups to fail but all of the resources within those failed test groups are marked good. In order to locate the defective resources in such test groups, the arrangement locates (1) a first test group that is tested non-operational and (2) a second test group that is tested non-operational. The first test group has a first number of the resources and the second test group has a second number of the resources. The arrangement then determines which of the first and second numbers of the resources is a shared resource by the first and second test groups. The shared resource is then identified as defective.

Other features and advantages of the present invention will become apparent from the following detailed description, taken in conjunction with the accompanying drawings, illustrating by way of example the principles of the invention.

BRIEF DESCRIPTION OF THE DRAWINGS

FIG. 10 shows how the defective resource shown in FIGS. 9A and 9B is detected and located.

DETAILED DESCRIPTION OF THE INVENTION

Figure 1:
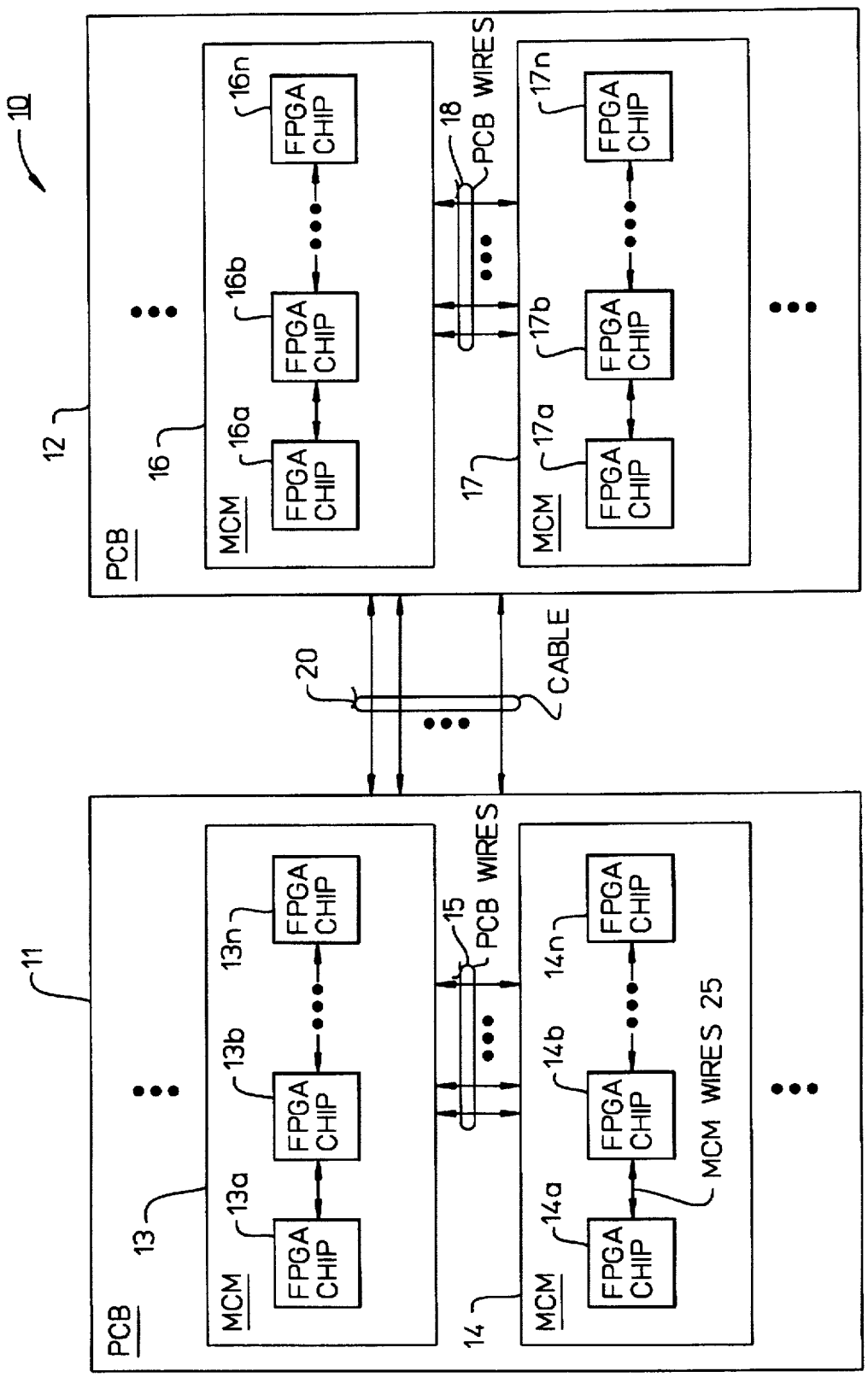
FIG. 1 shows a reconfigurable system having reconfigurable resources.
Figure 2:
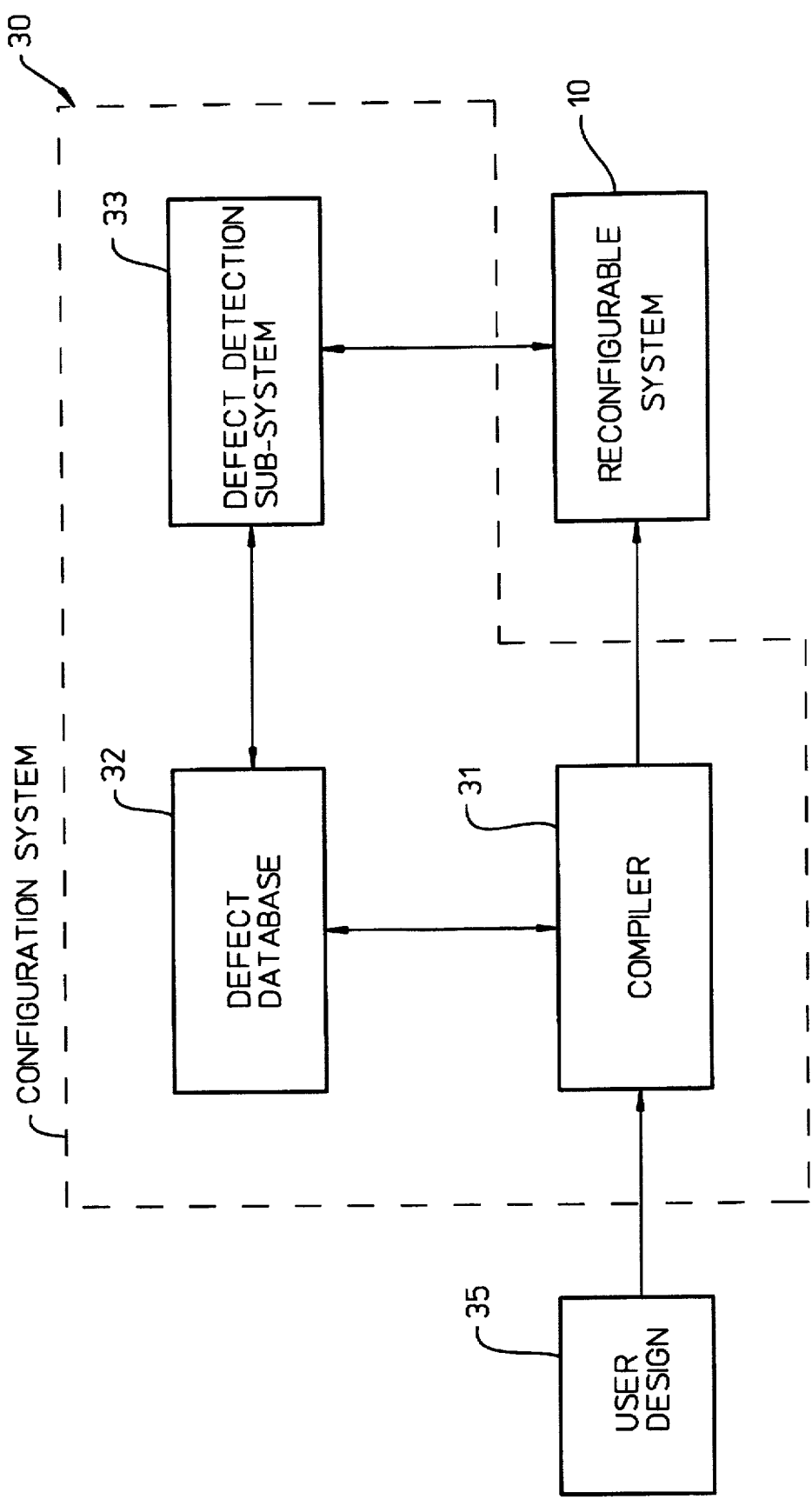
FIG. 2 shows a configuration system in accordance with one embodiment of the present invention for allowing the reconfigurable system of FIG. 1 to be a defect-tolerant reconfigurable system.

FIG. 1 illustrates a reconfigurable system 10 that can be configured and reconfigured to implement a functional system or logic circuit according to a user design 35 (shown in FIG. 2). As is known, a user design is a circuit description file (i.e., netlist) that contains a description of the components and interconnections of the given functional system or logic circuit. The system 10 can be any kind of reconfigurable digital or electronic system. For example, the reconfigurable system 10 can be a computer system having reconfigurable circuits, a logic design simulator for emulating logic designs, or any other kind of user reconfigurable system.

As can be seen from FIG. 1, the reconfigurable system 10 might include printed circuit boards (PCBs) 11 and 12, each having a number of multi-chip modules (MCMs) 13–14 and 16–17, respectively. Although FIG. 1 only shows PCBs 11 and 12, the reconfigurable system 10 is not limited to two PCBs. In practice, more than two PCBs can be included in the reconfigurable system 10. Moreover, although FIG. 1 shows two MCMs (i.e., MCMs 13–14 or 16–17) in each of the PCBs 11 and 12, each of the PCBs 11 and 12 can have more than two MCMs.

As can be seen from FIG. 1, each of the MCMs 13–14 and 16–17 includes a number of reconfigurable chips. For example, the MCM 13 includes a number of reconfigurable chips 13$a$ through 13$n$ and the MCM 17 includes a number of reconfigurable chips 17$a$ through 17$n$. In one embodiment, each of the reconfigurable chips of the reconfigurable system 10 is an FPGA chip. In alternative embodiments, these reconfigurable chips can be other kinds of reconfigurable chips. For example, a crossbar switch circuit can be used as the reconfigurable chip.

The MCM 13 is connected to the MCM 14 via PCB wires 15 and the MCM 16 is connected to the MCM 17 via PCB wires 18. Each of the MCMs 13–14 and 16–17 can be any kind of known multi-chip module.

Each of the FPGA chips within a MCM is connected to other FPGA chips via wire interconnections (e.g., MCM wires 25) in a conventional manner. Moreover, the PCB 11 is connected to PCB 12 via a multi-wire cable 20. Again, although one cable (i.e., the cable 20) is shown in FIG. 1 to connect the PCBs 11 and 12, many more multi-wire cables can be used to connect the PCBs 11 and 12. The wire interconnections can be "programmed" by closing switches within the FPGA chips to connect pairs of wires. This means that if one wire interconnection is found defective, a connection can still be established through another wire interconnection.

Each of the FPGA chips (i.e., 13$a$–13$n$, 14$a$–14$n$, 16$a$–16$n$, and 17$a$–17$n$) in the reconfigurable system 10 can be implemented by any known reprogrammable gate array. Each of the FPGA chips in the reconfigurable system 10 includes a number of programmable wire interconnections and/or gates (not all are shown in FIG. 1) that can be programmed and reprogrammed, thus allowing the reconfigurable system 10 to be configured to implement a desired functional system. A programmable gate in a FPGA chip can be a programmable transistor, a programmable logic gate, a block of programmable transistors, a programmable logic block, a programmable input and/or output circuit, or a combination of all the above-mentioned elements. Those programmable interconnections and gates as well as the wires of the cables and/or other interconnections in the reconfigurable system 10 are hereinafter collectively referred to as resources of the configurable system 10.

In short, the reconfigurable system 10 can be any kind of known parallel and/or reconfigurable system having numerous small and inter-changeable resources. In addition, a good resource within the reconfigurable system 10 can still be tested and used even if a number of other resources are defective. Moreover, because of the parallel nature of the system, there are few or no single points of failure that can make a large portion of the system unusable.

FIG. 2 shows a configuration system 30 that implements one embodiment of the present invention. The configuration system 30 is used to configure the reconfigurable system 10 in accordance with the user design 35. In accordance with one embodiment of the present invention, the configuration system 30 precisely detects and locates defective resources, if any, within the reconfigurable system 10 and avoids those defective resources when configuring the reconfigurable system 10 to implement a functional system or logic circuit in accordance with the user design 35 such that the reconfigurable system 10 becomes a defect-tolerant system.

As can be seen from FIG. 2, the configuration system 30 includes a compiler 31, a defect database 32, and a defect detection subsystem 33. The compiler 31 is used to configure (i.e., program or reprogram) the reconfigurable system 10 in accordance with the user design 35. In one embodiment, the user design 35 is accomplished with schematic-capture tools, which allow the designer to enter symbolic representations of components and interconnections for a particular circuit or system. In another embodiment, the user design 35 is accomplished with synthesis tools, which allow the designer to describe textually the function of a particular circuit design through various hardware description languages (HDL).

In accordance with one embodiment of the present invention, the compiler 31 receives data or information regarding all the defective resources of the reconfigurable system 10 from the defect database 32 when configuring the reconfigurable system 10 in accordance with the user design 35. This allows the compiler 31 to avoid the defective resources within the reconfigurable system 10 when configuring the reconfigurable system 10 to implement the user design 35. The defect database 32 is established by the defect detection subsystem 33. The defect detection subsystem 33 detects and locates all defective resources, if any, within the reconfigurable system 10 in accordance with one embodiment of the present invention. The defect detection subsystem 33 then stores the defective resource data in the defect database 32. The defective resource data typically describe and identify the locations and/or types of the defective resources within the reconfigurable system 10.

In one embodiment, the database 32 stores two data entries for each defective resource, one being the resource type entry and the other being the resource location. In another embodiment, the defect database 32 stores the data of all the defective resources in the reconfigurable system 10 in a lookup table format. This means that, for example, a status field is provided for each data structure in the database 32 that represents one of the resources of the reconfigurable system 10. When the defect detection subsystem 33 detects and locates a defective resource in the reconfigurable system 10, the defect detection subsystem 33 makes an entry into the status field of the corresponding data structure representing the defective resource to indicate that this particular resource is defective. When a resource of the reconfigurable system 10 is found not to be defective, the defect detection subsystem 33 does not make an entry into the status field of the corresponding data structure representing that resource. By doing so, a lookup table is established in the defect database 32 for all the resources of the reconfigurable system 10. Alternatively, other data formats or structures can be used in the defect database 32 to store the data of the defective resources of the reconfigurable system 10.

The defect detection subsystem 33 precisely detects and locates the defective resources within the reconfigurable system 10 in accordance with one embodiment of the present invention. The defect detection subsystem 33 does this in an efficient and cost effective manner.

At the beginning of testing, the status of all of the resources is unknown, i.e., not known to be good or defective. The resources are configured into test groups for testing. When test groups pass, the resources within those test groups are marked good, i.e., non-defective. When all tests are complete, the resources that have never been marked good are considered to be defective and the defect database 32 is created or modified to reflect the defective status of those defective resources.

The resources of the reconfigurable system 10 cannot be tested to be good or bad all by themselves because individually the resources have too little function to be configured as reasonable test circuits. Therefore, groups of resources are tested together. The tests are designed such that if a defective resource is included in such a test group, the test will fail. Otherwise, the test will pass.

However, if a test group includes a defective resource, then the test group fails the test and none of the good resources within the test group is established as a good resource. This is because resources are marked good only when they are in a test group that passes a test. The key to solving this problem is redundant testing, in which each resource is tested multiple times, each time grouped with a different set of other resources. With redundant testing, a good resource has a very high likelihood of eventually being grouped into a test system with all other good resources and, thus, being marked or identified as good or non-defective.

First, the defect detection subsystem 33 configures all the resources, defective and non-defective, of the reconfigurable system 10 into a number of test groups or systems. In one embodiment, each test system is a random number generator that generates a given random number based on a given random input number during one clock cycle. The random number generator is essentially a circuit which produces a predicable sequence of boolean values that thoroughly excise the elements under test.

After the defect detection subsystem 33 configures all the resources of the reconfigurable system 10 into a number of random number generators, the defect detection subsystem 33 runs each of the random number generators through a given number of clock cycles (e.g., 100–1000 clock cycles) with a given starting number. After the given number of clock cycles, the defect detection subsystem 33 obtains a final output number for each of the random number generators. The defect detection subsystem 33 determines whether a random number generator is operational by comparing the final output number of that random number generator with a predetermined output number of the random number generator. The predetermined output number is the expected output number of the random number generator if the random number generator is operational.

If the final output number of the random number generator matches the predetermined output number, then that random number generator is operational and the defect detection subsystem 33 marks or identifies each of the resources within that random number generator as non-defective. Thus, the resources that are never marked good are indirectly determined to be defective (i.e., bad).

When the defect detection subsystem 33 finishes checking all of the random number generators, the defects detection subsystem 33 reconfigures the resources into a different set of random number generators and repeats the testing. The defect detection subsystem 33 continues to do so until substantially all of the non-defective resources of the reconfigurable system 10 have been marked or identified as non-defective. The criterion for sufficiently reconfiguring the resources into various sets of random number generators is such that the intersection of all sets which contain a given resource is just that one resource. In doing so, a single defective resource cannot cause another good resource to fail all its tests. Assuming defective resources are rare, it is thus most unlikely that a non-defective resource will always be configured with a defective resource. This thus allows the defect detection subsystem 33 to find all of the good resources.

In one embodiment, the defect detection subsystem 33 is implemented as a software program. In other embodiments, the defect detection subsystem 33 can be implemented by other means. For example, the defect detection subsystem 33 can be implemented in discrete hardware or firmware. As a further example, the defect detection subsystem 33 can be implemented by a combination of hardware and software. The defect detection subsystem 33 will be described in more detail below, in conjunction with FIGS. 4A through 14.

The compiler 31 can be implemented by various known software compiling programs. In one embodiment, the compiler 31 is implemented by a software program. In alternative embodiments, the compiler 31 can be implemented by firmware and/or discrete hardware.

As described above, the function of the compiler 31 is to map or translate the user design 35 onto the reconfigurable system 10. As is known, the user design 35 is a circuit description file (i.e., netlist). The netlist contains a description of generic or abstract components and interconnections of the circuit. The compiler 31 first maps the generic components into the reconfigurable system-specific boolean functions (i.e., physical mapping). The compiler 31 then places each system boolean function (i.e., system-specific component) to an actual physical location inside the reconfigurable system 10. At this time, the compiler 31 receives data from the defect database 32 such that the compiler 31 can avoid the defective gates when placing the system-specific component to an actual physical location of the reconfigurable system 10.

After the compiler 31 has successfully placed all physical gates or components onto the reconfigurable system 10, the compiler 31 then configures the interconnections of the reconfigurable system 10 to connect those physically placed gates together. At this time, the compiler 31 also accesses the database 32 for the defect resource data such that the compiler 31 can avoid the defective interconnections when connecting the physically placed gates together. In one embodiment, the compiler 31 is a reconfigurable system-specific compiler. Alternatively, the compiler 31 may not need to be a reconfigurable system-specific compiler.

By establishing the defect database 32 that stores the defective resource data, the compiler 31 is able to avoid those defective resources when configuring the reconfigurable system 10 to implement the user design 35. This thus allows the reconfigurable system 10 to be a defect-tolerant system.

Figure 3:
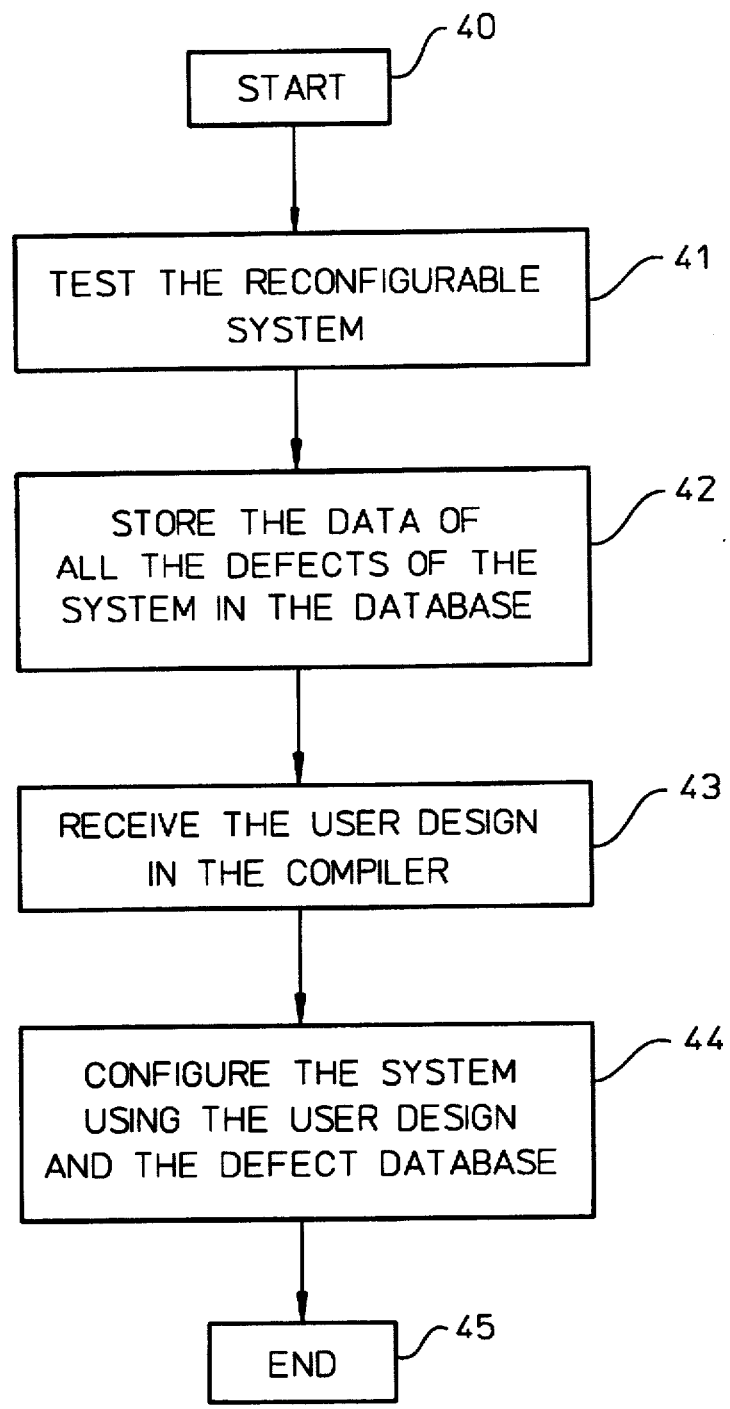
FIG. 3 is a flow chart diagram illustrating the configuration process of the configuration system of FIG. 2 in accordance with one embodiment of the present invention.

FIG. 3 shows in flow chart diagram from the operational process of the configuration system 30 of FIG. 2. As can be seen from FIGS. 2 and 3, the process starts at step 40. At step 41, the defect detection subsystem 33 of the configuration system 30 detects and locates all the defective resources of the reconfigurable system 10. Then the data of all of the defective resources of the reconfigurable system 10 is stored in the database 32 at step 42. At step 43, the compiler 31 receives the user design 35.

When the user design 35 is received, the compiler 31 also accesses the defect database 32 for the data of the defective resources. The compiler 31 then configures the reconfigurable system 10 in accordance with the user design 35 and the data of the defective resources of the reconfigurable system 10 at step 44. In this case, the compiler 31 uses the data of the defective resources obtained from the defect database 32 to avoid those defective resources when configuring the reconfigurable system 10 in accordance with the user design 35. By doing so, the reconfigurable system 10 allows defects to exist in the system while still being able to be configured to implement a functional system (i.e., defect-tolerant). The process then ends at step 45. It is to be noted that step 41 only needs to be executed once while steps 43-44 may be repeated many times using the data stored in the database 32.

Figure 4A:
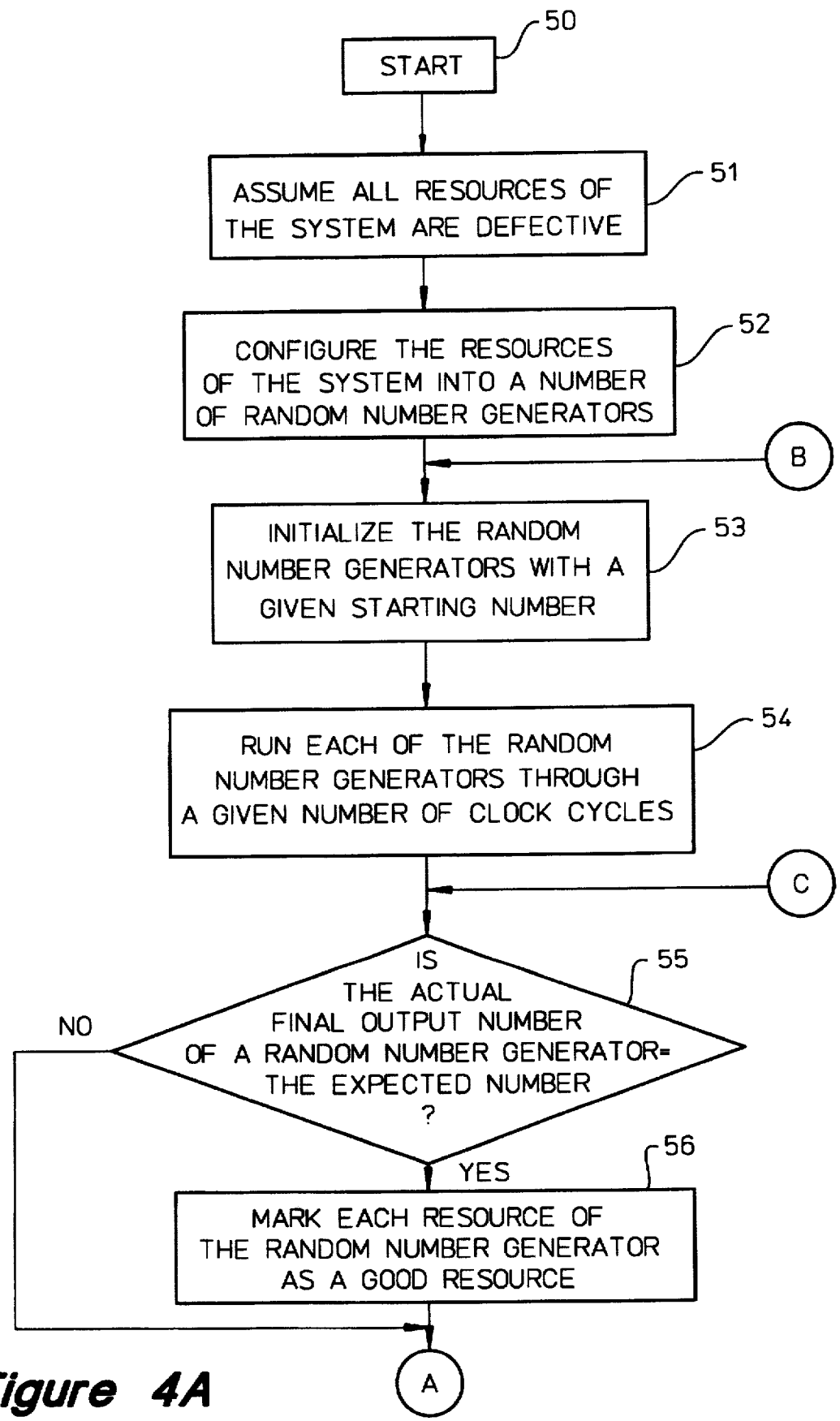
FIGS. 4A and 4B show the process of the defect detection subsystem of the configuration system of FIG. 2 for detecting and locating defective resources in the reconfiglurable system of FIG. 1 in accordance with one embodiment of the present invention.
Figure 4B:
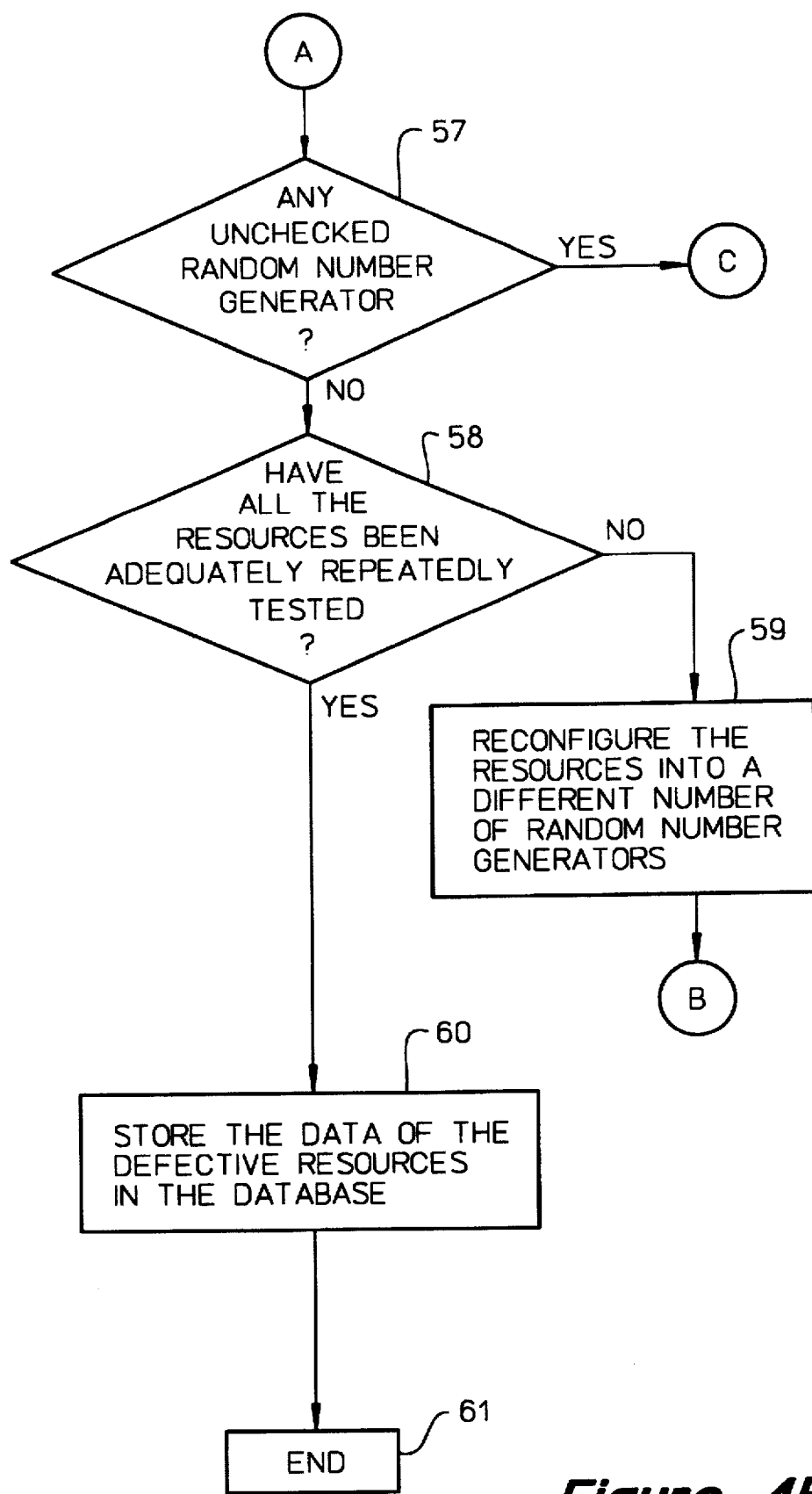

FIGS. 4A and 4B show the flow chart diagram of a basic process of the defect detection subsystem 33 (FIG. 2) for detecting and locating the defective resources in the reconfigurable system 10 of FIGS. 1 and 2 in accordance with one embodiment of the present invention. FIGS. 5A-5D schematically illustrate how the defective resources (i.e., resources 71b and 71 c) of the reconfigurable system 10 are located through the basic process shown in FIGS. 4A and 4B. In FIGS. 5A-5D, the reconfigurable system 10 is shown with resources 71-71d, 72-72d, 73-73d, 74-74d, and 75-75d. It is appreciated that the reconfigurable system 10 is not limited to those resources and would probably include many more resources. FIGS. 5A-5D are provided only to aid in the description of the operation of the defect detection subsystem 33 shown in FIGS. 4A-4B.

Figure 5A:
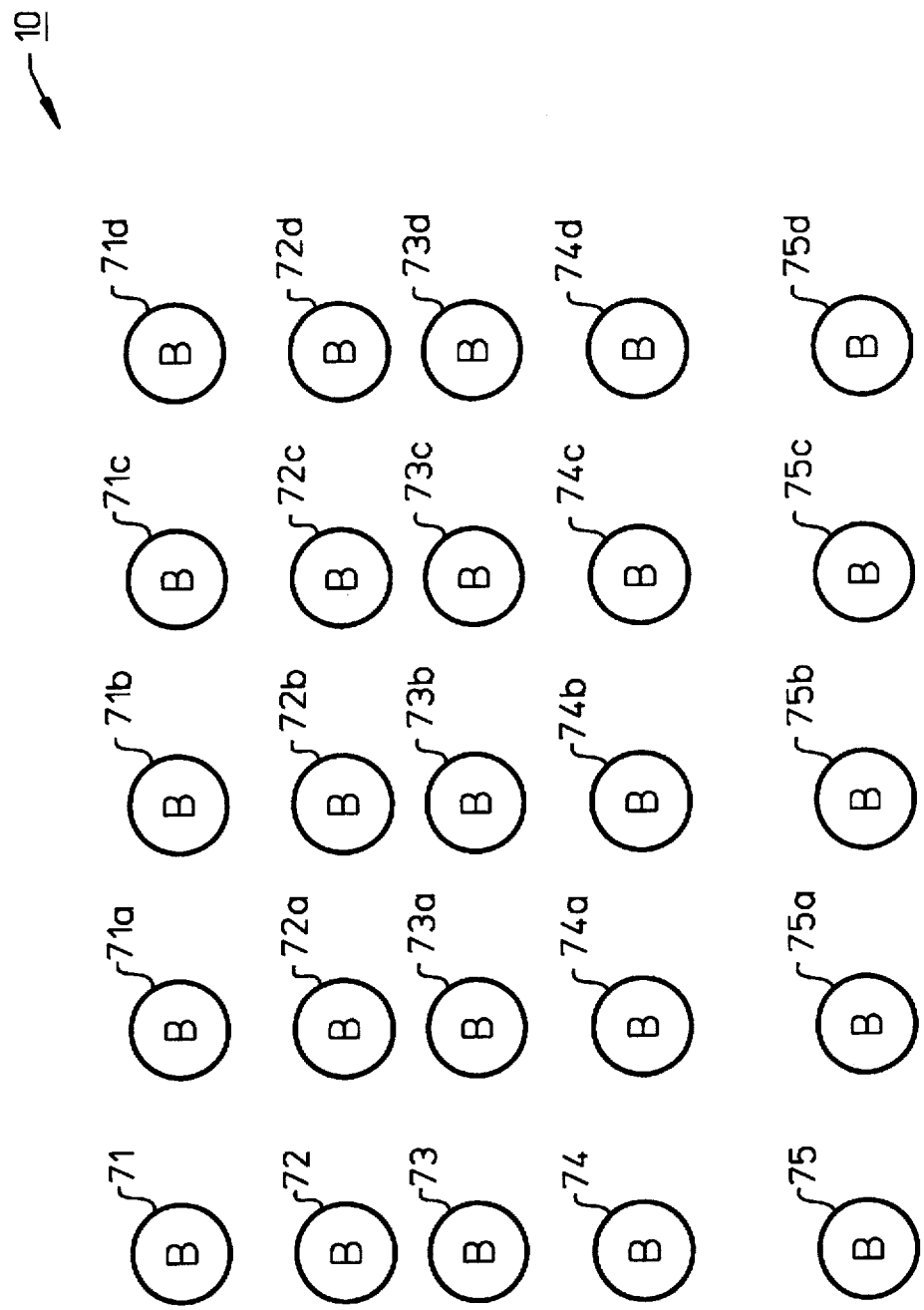
FIGS. 5A through 5D schematically show the resources of the reconfigurable system of FIG. 1 tested by the defect detection subsystem of FIGS. 2 and 4A–4B.
Figure 5B:
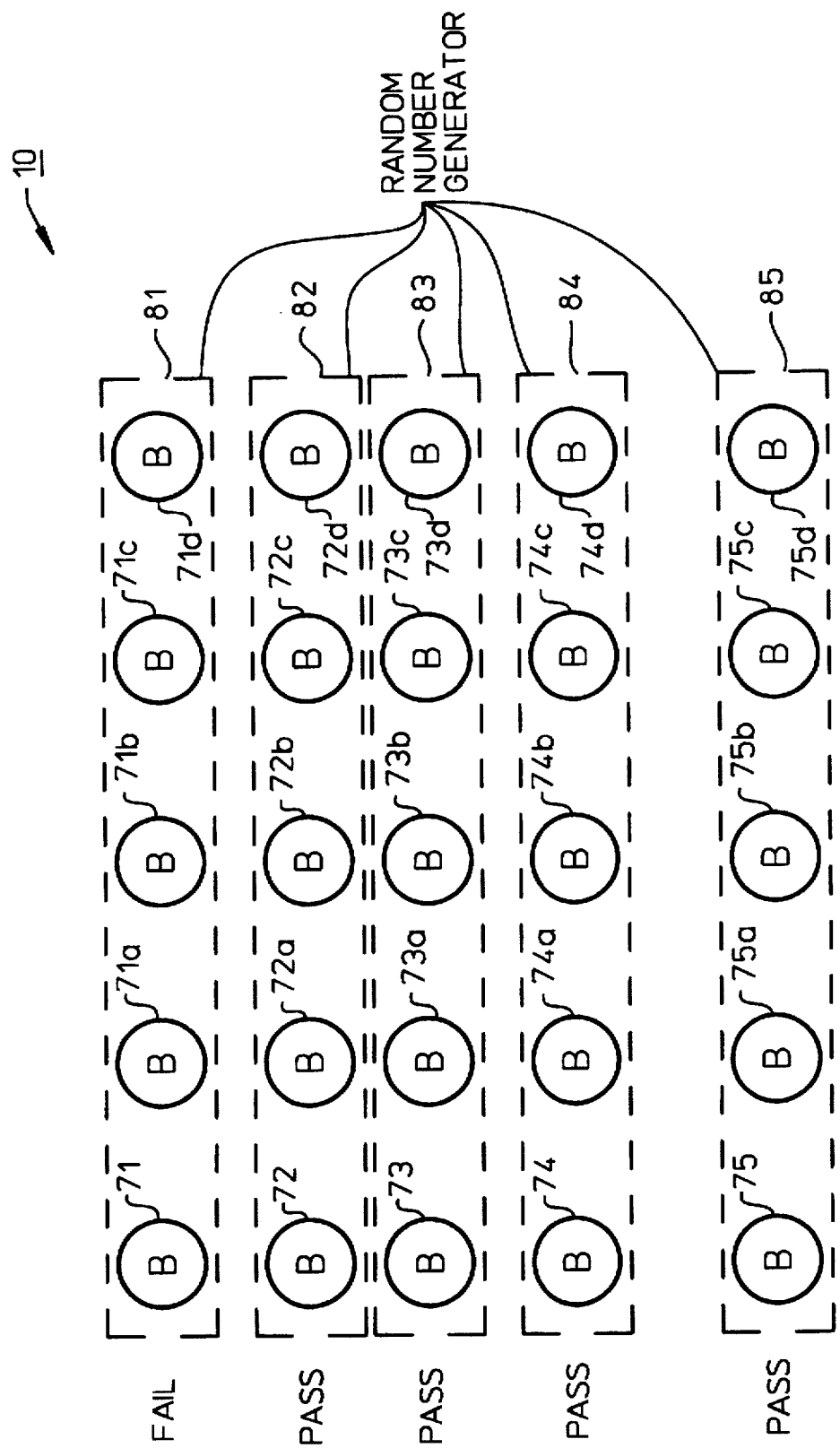

As can be seen from FIGS. 4A-4B, the process first assumes that all the resources of the reconfigurable system 10 are defective at step 51 (see FIG. 5A). Then the resources of the system 10 are configured into a number of random number generators 81 through 85 at step 52 (see FIG. 5B). At step 53, each of the random number generators 81-85 (FIG. 5B) is initialized with a given starting number. At step 54, each of the random number generators 81-85 is run through a given number of clock cycles to produce a final output number. Then the process goes to step 55 to determine if the final output number of a random number generator (e.g., generator 81) matches a predetermined output number of the random number generator. The predetermined output number is the expected output number of the random number generator. If the final output number of the random number generator matches the expected output number, it means that the random number generator is operational and each resource within the random number generator is marked as a healthy or non-defective resource at step 56 (see FIG. 5C). If the final output number of the random number generator does not match the expected output number, the random number generator is faulty and step 56 is skipped (see FIG. 5C).

Then the process moves to step 57 at which it is determined if there is another uncompared random number generator. If so, step 55 is repeated. If not, step 58 is executed at which time it is determined whether the resources of the reconfigurable system 10 have been adequately and repeatedly tested.

The number of times for configuring and reconfiguring the resources into various sets of random number generators for adequately testing the resources depends on the physical layout of the reconfigurable system 10. The objective for determining the number of times is to mark every non-defective resource good or non-defective. The more times a good resource is configured and tested, the more likely the good resource can be identified or marked as good or non-defective.

Figure 14:
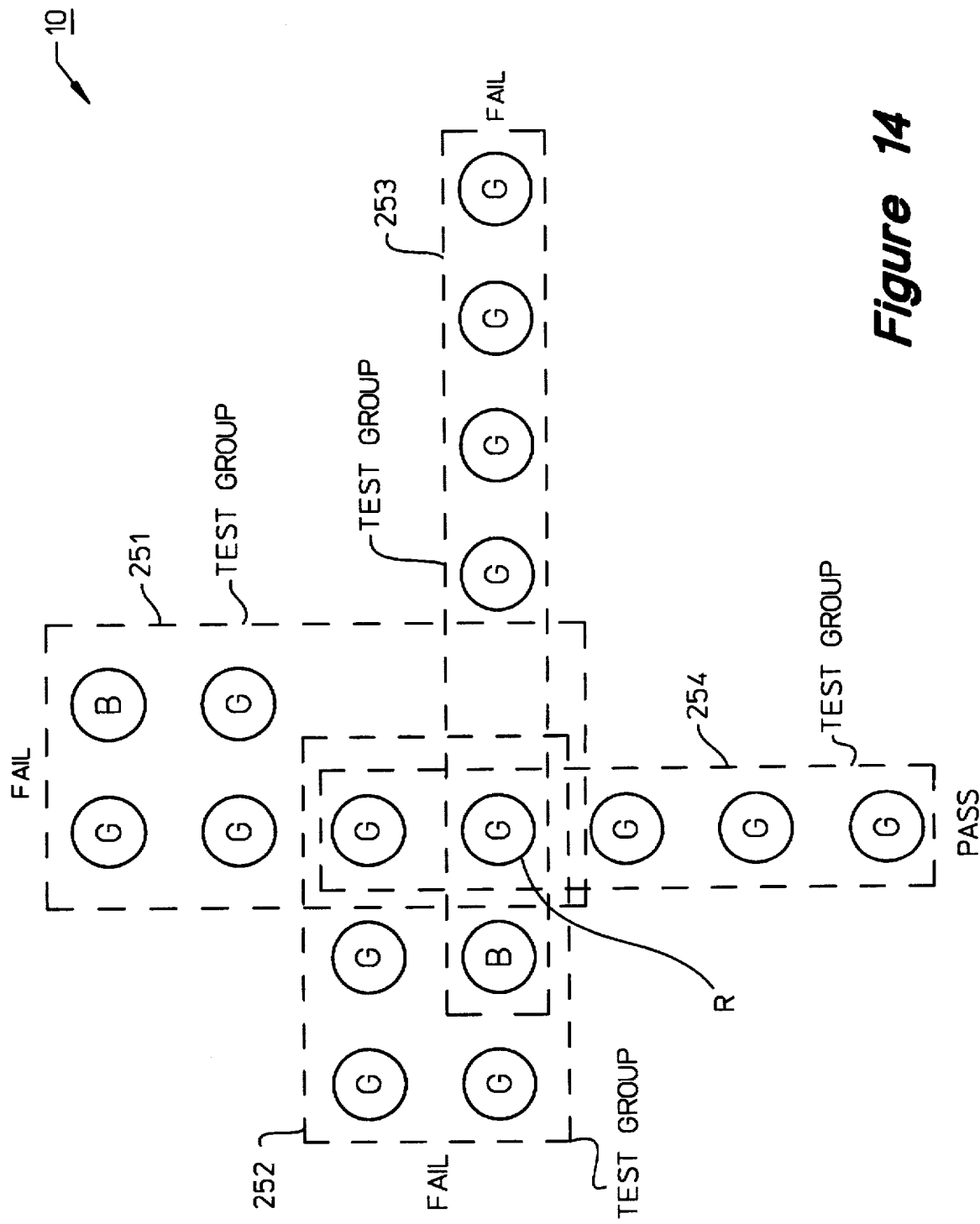
FIG. 14 shows another example of how the defect detection subsystem of FIGS. 2 and 4A and 4B test the resources of the reconfigurable system of FIG. 1.

In other words, for a given good resource R, if the intersection of the sets of resources used to test the resources R is just the resource R itself, then the resource R will be marked good in the presence of a single defective resource. However, more tests may be needed to increase the likelihood of marking the resource R good in the presence of multiple defective resources (FIG. 14).

In one embodiment, the number of times for configuring the resources into different sets of random number generators to detect any defective resource in the system 10 range from five times to ten times. Alternatively, the number of times can be more than ten times or fewer than five times.

Figure 5C:
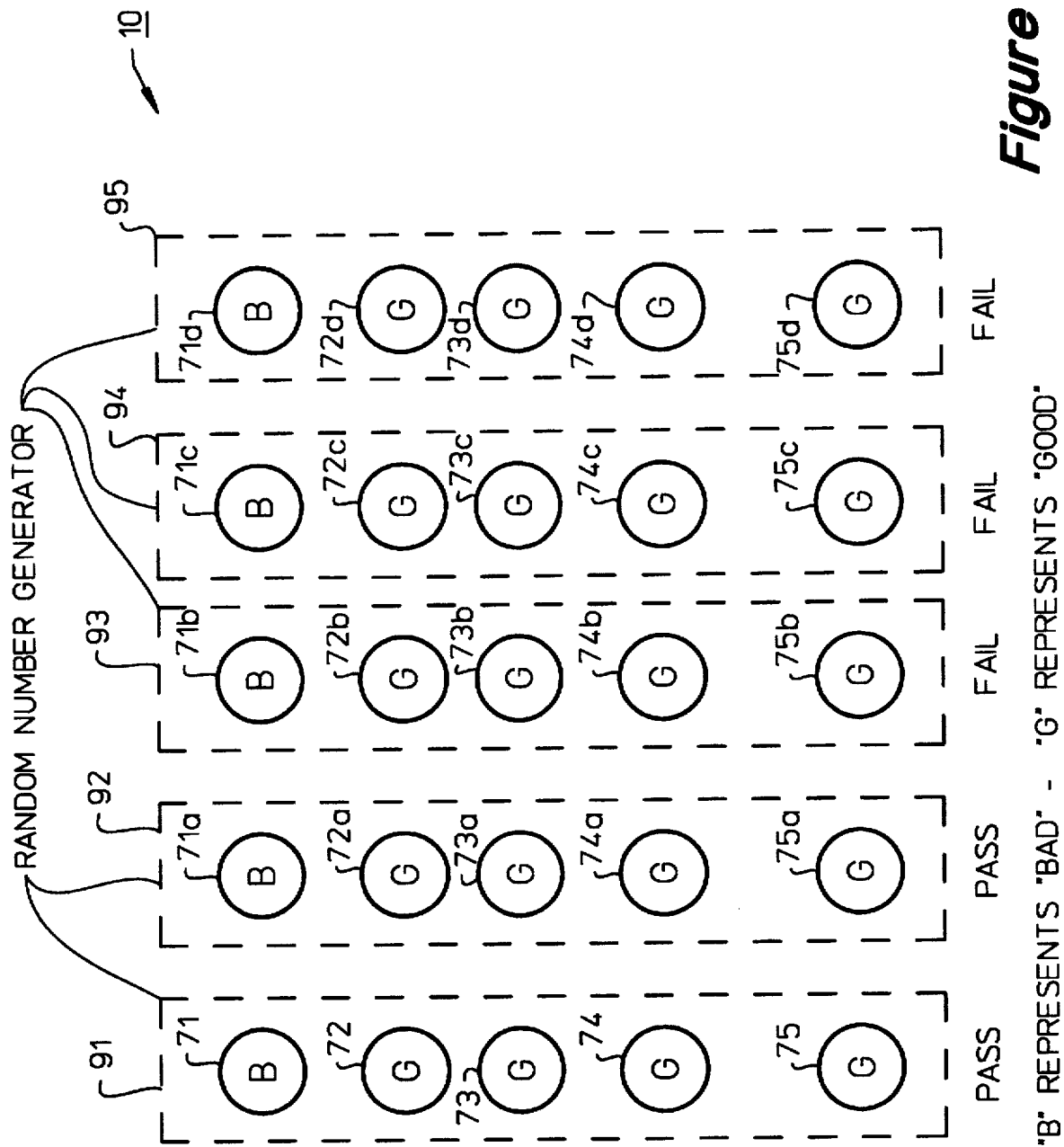
Figure 5D:
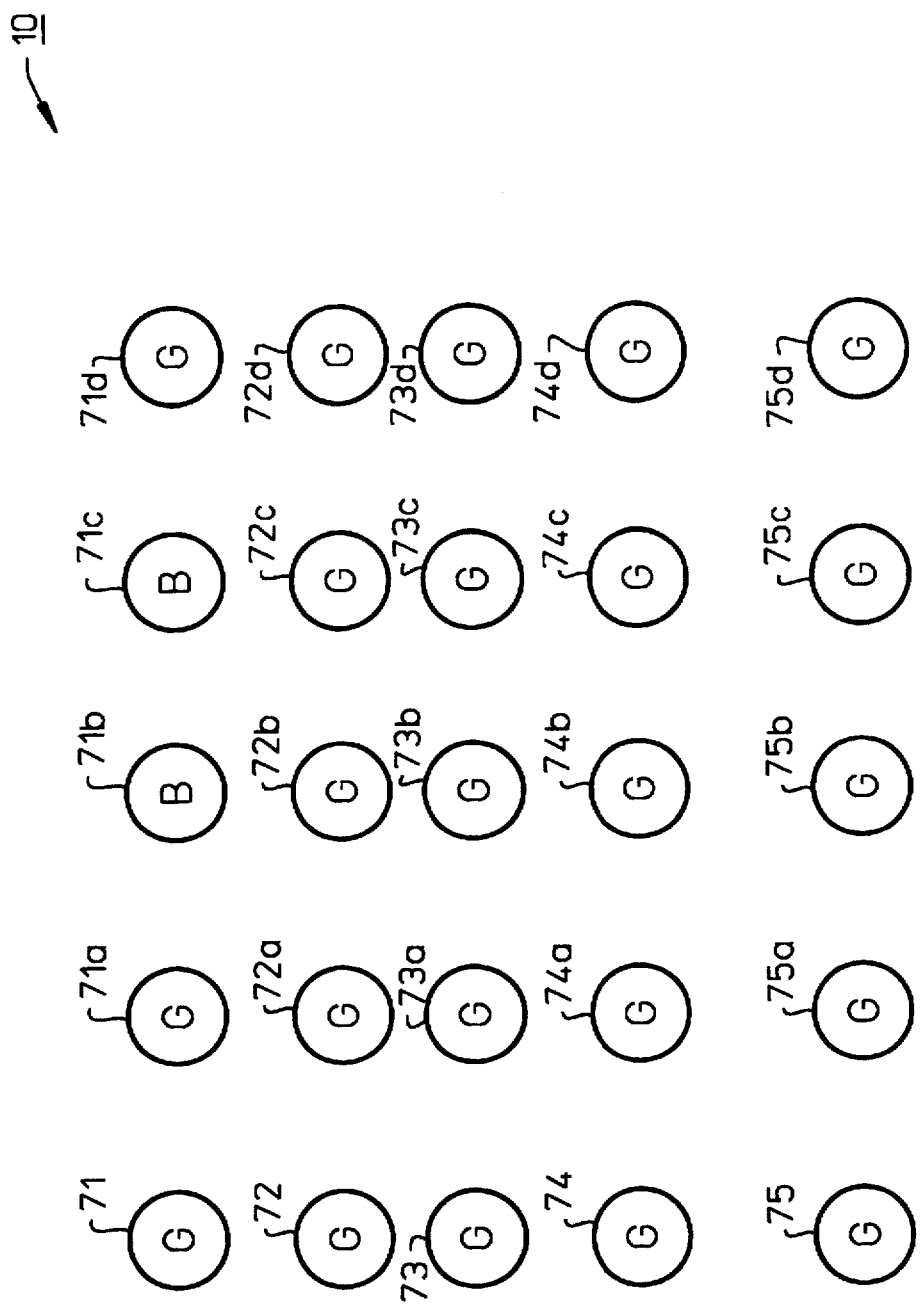

When at step 58, it is determined that the resources have not been adequately tested, then step 59 is performed to reconfigure the resources into a different set of random number generators (e.g., the random number generators 91 through 95 of FIG. 5C). The process then repeats the steps 53–57 to test each of the random number generators 91–95 and mark the resources within the random number generators that pass the test (see FIGS. 5C and 5D).

If, at step 58, it is determined that no more test is needed, step 60 is then performed to store the data of those defective resources (see FIG. 5D) in the database 32 (FIG. 2). It is to be noted that the marked defective resources may sometimes include a number of non-defective or good resources that fail to be identified or marked as good during the test. This may be caused by the circuit layout of the system that makes it not possible to vindicate those good resources through the test. Another reason is that it may not be cost-justified to include more tests to vindicate those good resources.

Figure 6:
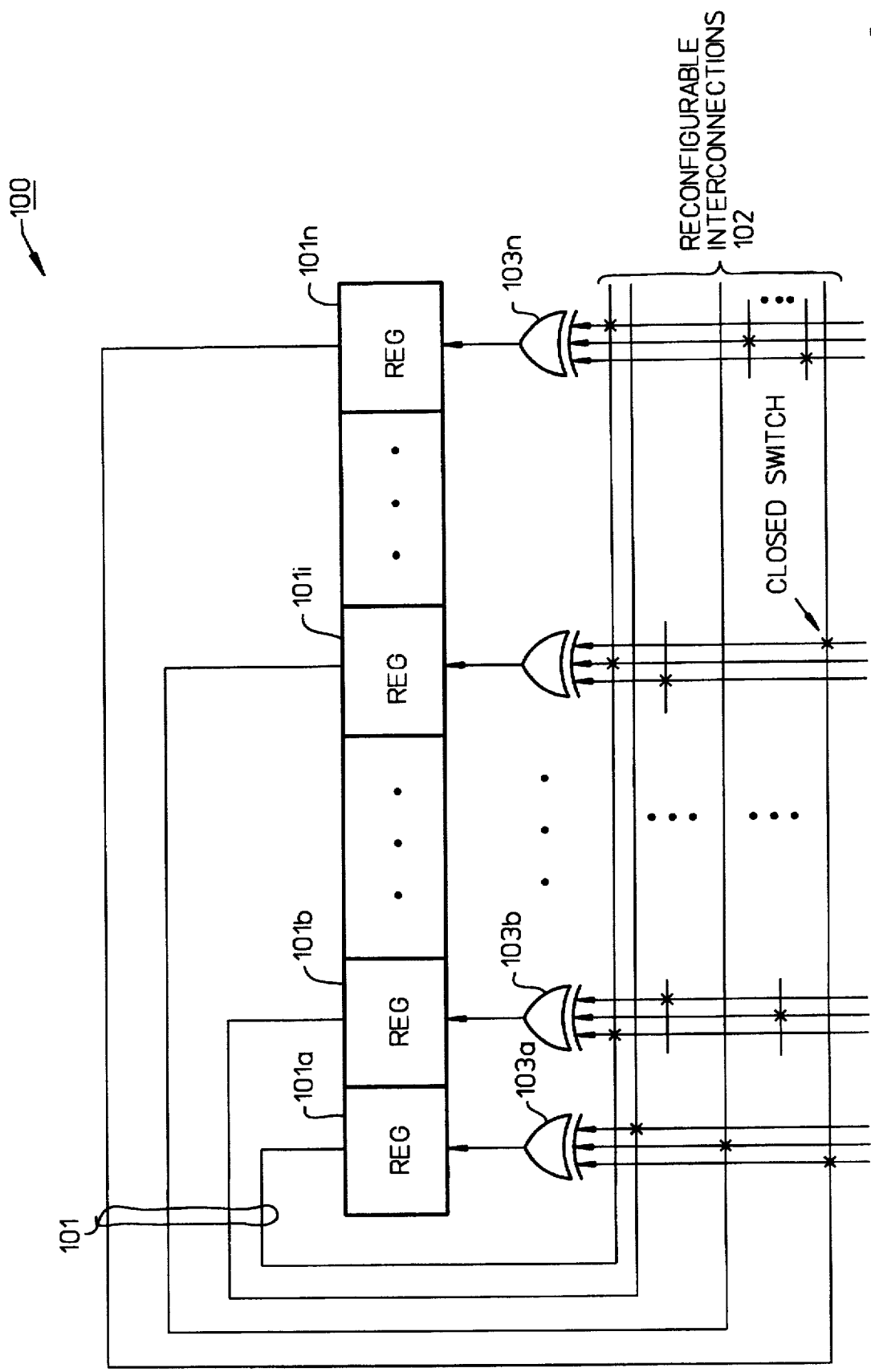
FIG. 6 shows a random number generator configured using some of the resources of the reconfigurable system of FIG. 1.
Figure 7:
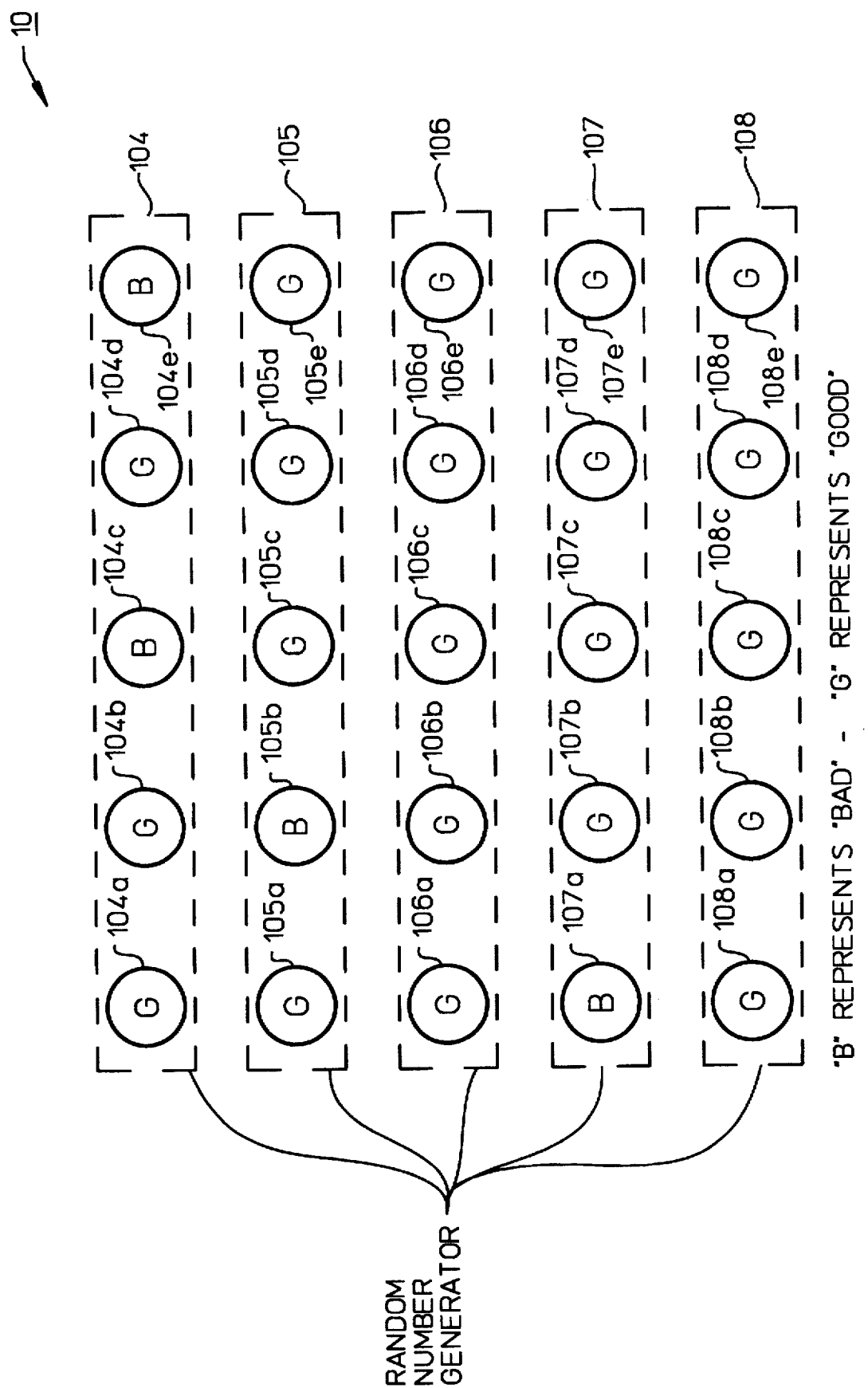
FIG. 7 illustrates how the defect detection subsystem of FIG. 2 identifies individual defective resources within a random number generator in accordance with another embodiment of the present invention.

FIG. 6 shows the circuit of a random number generator 100 configured using some of the resources of the reconfigurable system 10. In FIG. 6, crossbar switches are closed such that (1) every register output drivers one input of three different exclusive OR gates, and (2) the resulting random number generator generates long sequences of numbers none of which is equal to another. Using the arrangement shown in FIGS. 4A and 4B, the defect detection subsystem 33 (FIG. 2) either identifies each resource of the random number generator 100 as non-defective (i.e., when the generator 100 passes the test) or still assumes each resource of the generator 100 as defective (i.e., if the generator 100 fails the test). The arrangement shown in FIGS. 4A–4B, however, cannot determine the good resources within the generator 100 when the generator 100 fails the test. Those good resources can only be vindicated when being configured into other random number generators that do not contain any defective resource.

In order to speed up the test, in accordance with another embodiment of the present invention, some of the non-defective resources within the generator 100 can be found even if the generator 100 fails the test. As can be seen from FIG. 6, the random number generator 100 includes a number of sub-circuit, each having (1) a register, (2) an exclusive OR gate driving the register, (3) wires and switches connecting the inputs of the exclusive OR gate to several outputs of other exclusive OR gates. Thus the sets of resources that pass or fail as a group do not need to consist of the entire random number generator. Instead, the sets of resources which pass or fail as a group can be considered as merely an exclusive OR gate, a register, and wires and switches which connect the register outputs to the inputs of the gate. This indicates that the sub-circuits of the generator 100 can be tested quite independently during a single clock cycle.

One of the advantages of this technique or arrangement is to build a relatively large random number generator that generates many different numbers to thoroughly test the resources. Another advantage of the technique is that the actual sets of resources (i.e., the number of resources) which pass or fail the test as a group are small. In this case, when a set of resources fails the test, only that small number of resources can not be determined to be good or bad.

Figure 8A:
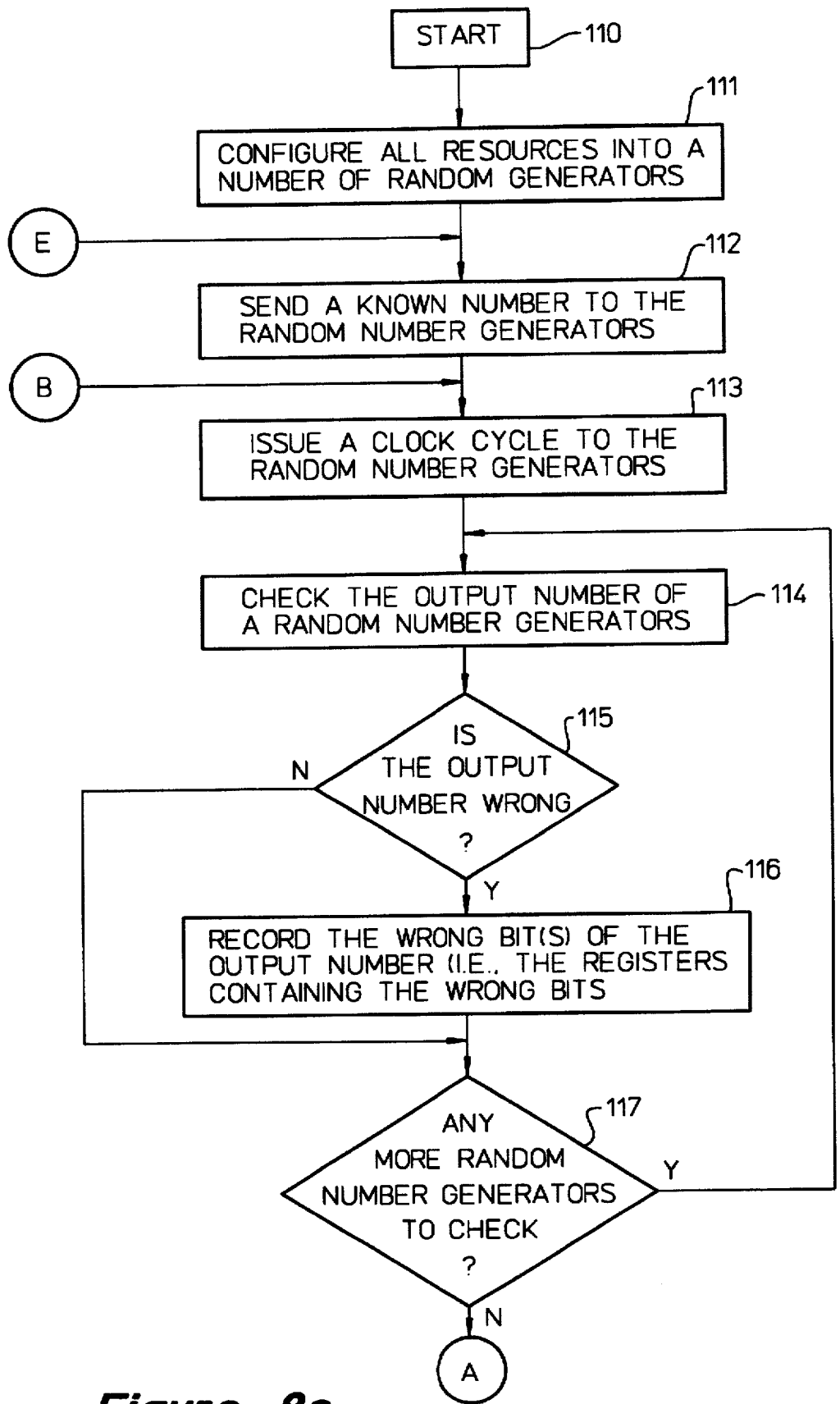
FIGS. 8A and 8B show the process of the defect detection subsystem of FIG. 2 for individually identifying the defective resources in the reconfigurable system of FIG. 1 during testing.
Figure 8B:
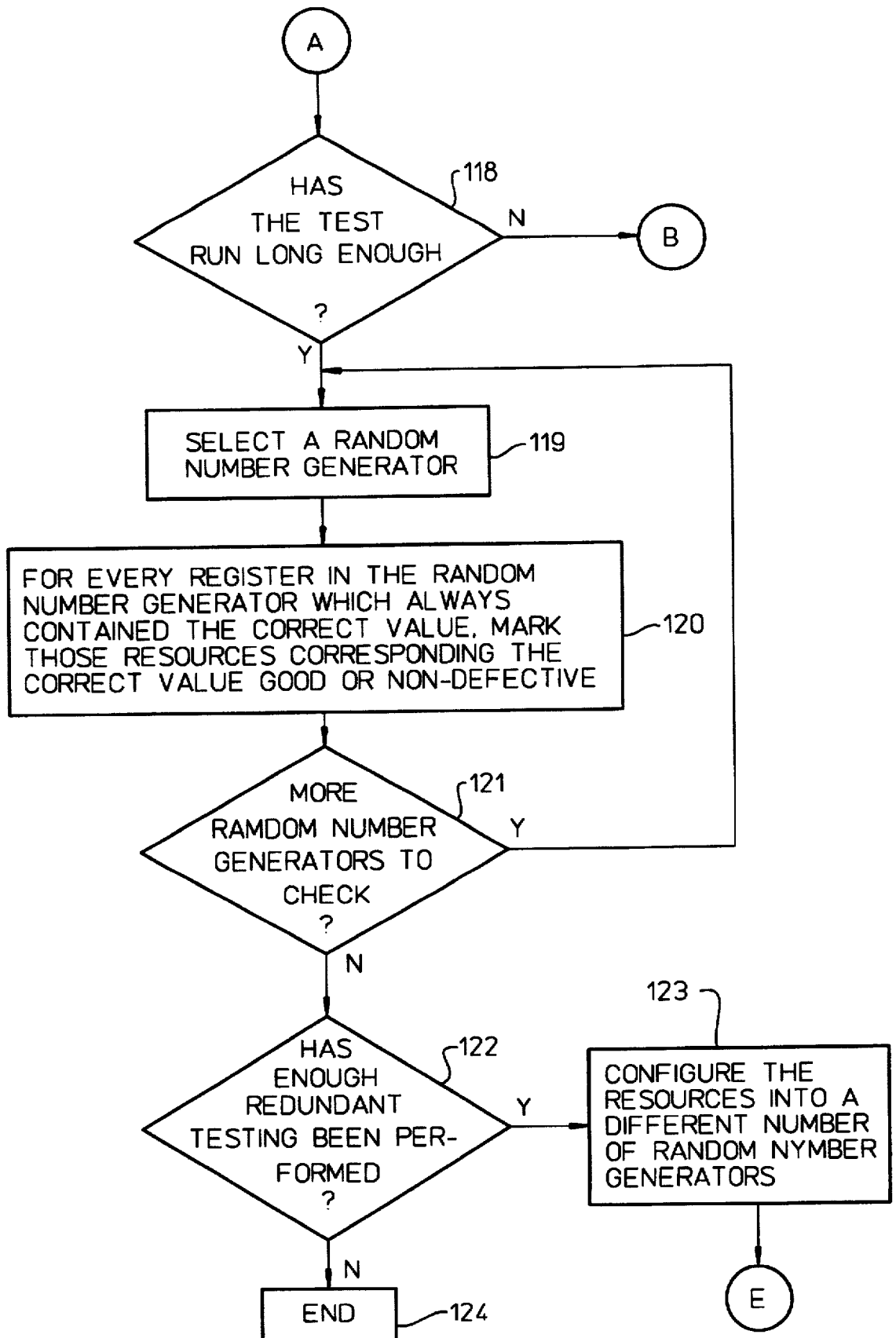

In accordance with this embodiment of the present invention, the output number of a random number generator is checked against an expected output number (through software simulations of the generator) at the end of each clock cycle. If the numbers match, the test continues with another clock cycle until the end of the test. If, however, the numbers do not match, the value of each register within the random number generator, i.e., each bit of the random number, is checked to determine if it is correct (see FIG. 7). By doing so, many of the good resources within the random number generator can be identified even if the generator fails the test (i.e., the final output number does not match the expected output number). This method is referred to as fine-grain defect detection. FIGS. 8A and 8B show the process of individually marking or identifying the non-defective resources within a failed random number generator.

As can be seen from FIGS. 8A and 8B, the process starts at step 110. At step 111, the resources are configured into a number of random number generators. At step 112, a known number is sent to the random number generators. At step 113, a clock cycle is issued to the random number generators. At step 114, the output number of one of the random number generators is checked against an expected output number. At step 115, if it is determined that the output number is wrong (i.e., the output number is not equal to the expected output number), then step 116 is performed. Otherwise, step 116 is skipped.

At step 116, the bit or bits of the output number (i.e., the registers of those bits) are recorded. Then step 117 is performed to determine whether there is at least one more random number generator to check. If so, the process returns to step 114. Otherwise, step 118 is performed to determine whether the test has run long enough (i.e., if more clock cycle is needed). If so, the process proceeds to step 119. If not, the process returns to step 113. At step 119, the tested random number generator is again selected. At step 120, the register or registers of the random number generator that always contained the correct value during the test are marked good or non-defective even though the random number generator may have failed the test.

At step 121, it is determined whether more random number generators need to be checked. If so, step 119 is repeated. If not, step 122 is performed, at which it is determined if enough redundant testing has been performed (i.e., if the resources have been repeatedly tested in various sets of random number generators). If so, the process ends at step 124. If not, the process returns to step 112 via step 123. At step 123, the resources are again configured into a different number of random number generators.

Steps 113–116 are performed by observing the register values via the scan chain on each cycle. Using the register values observed at the end of the previous clock cycle and a software simulation of the random number generator, the value of each register at the end of the current cycle can be predicated. Even if the random number generator contains a defective resource and its current output number is not what would be expected for a non-defective random number generator, useful testing can still continue since the actual state at the end of each clock cycle is either used for the predication by software simulations or changed to the expected output number before the next clock cycle.

In one embodiment, the number of clock cycles used to run a random number generator ranges between 100 clock cycles to 1000 clock cycles. Alternatively, this number of clock cycles employed can be more than 1000 clock cycles or fewer than 100 clock cycles.

Figure 9A:
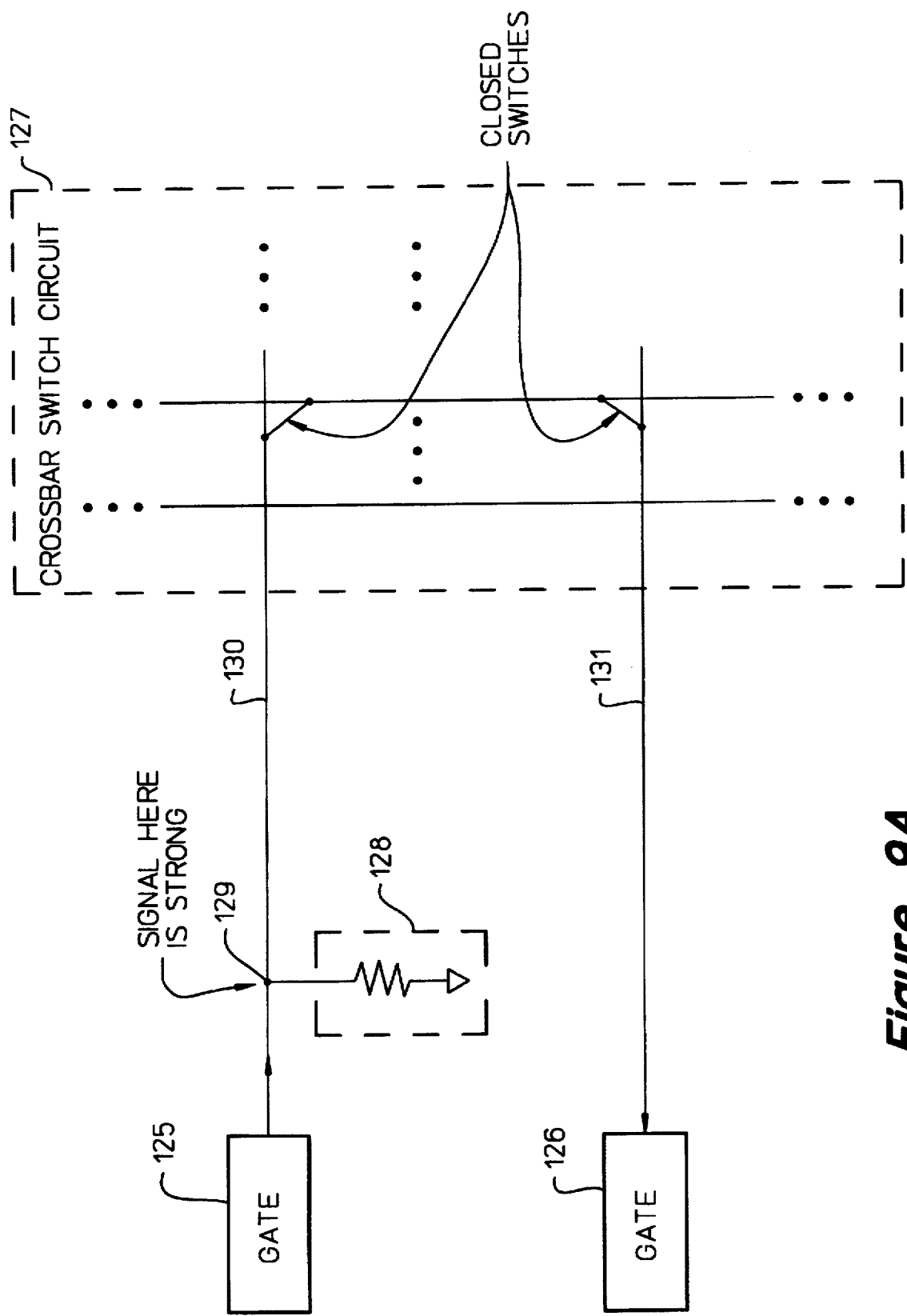
FIGS. 9A and 9B show a portion of a circuit structure of the reconfigurable system of FIGS. 1 and 2 where the defective resource may not be detected and located during some tests.
Figure 9B:
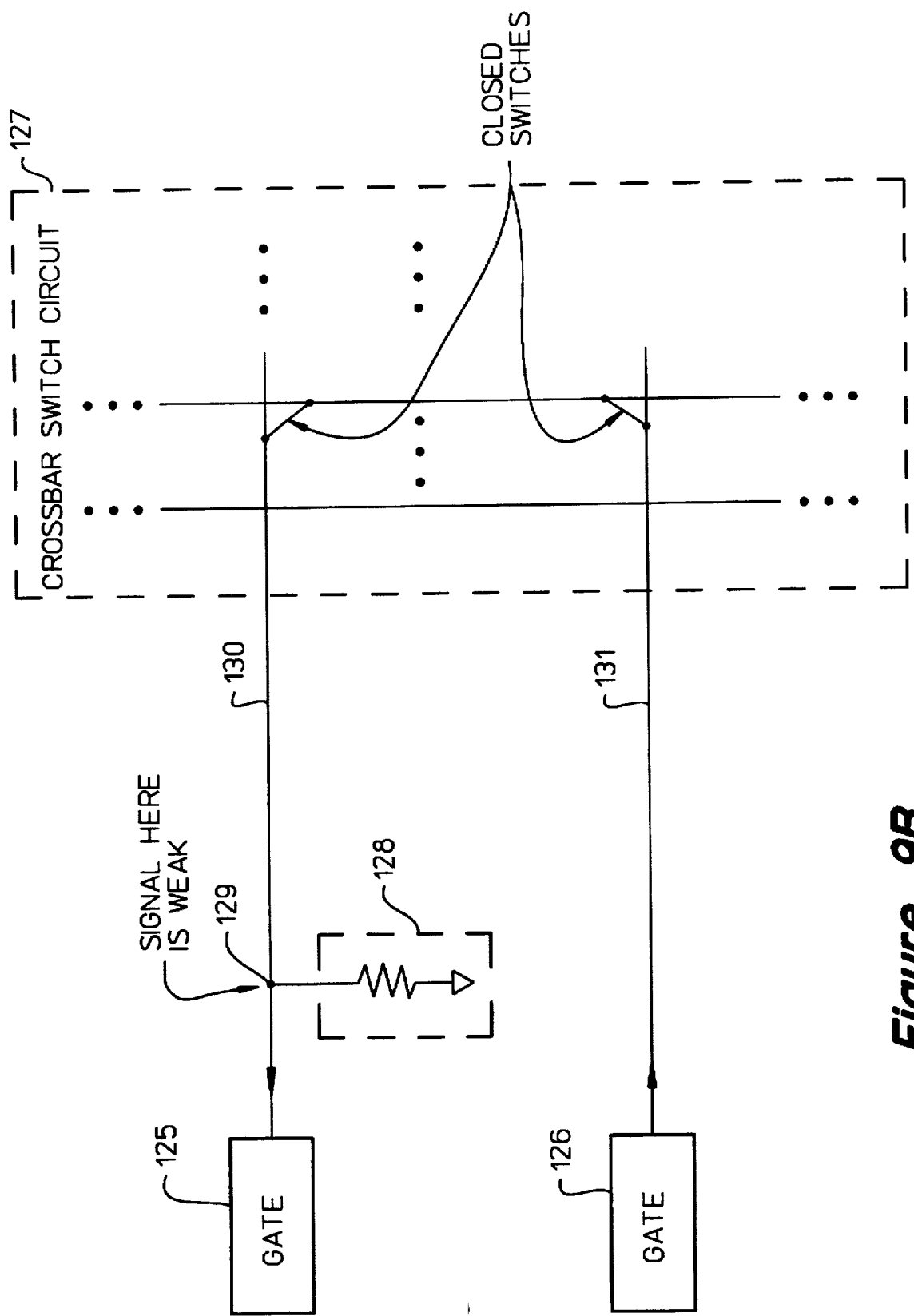

Referring back to FIGS. 1 and 2, the reconfigurable system 10 may include some resources that are defective in such a way that they behave correctly in some tests (i.e., when built into some circuits) and behave incorrectly in others. This type of defect is referred to as a weak defect and this type of resource is referred to as a weakly defective resource. Because these resources are unreliable, they need to be detected and identified as defective so the compiler 31 will not use them. A weak defect can result from an amplifier which delivers less than normal driving power, a wire with higher than normal resistance, a crossbar switch with higher than normal resistance, or a resource with a short, through significant resistance, to power, ground, or another signal. FIGS. 9A and 9B show an example of the weak defect, which will be described in more detail below.

As can be seen from FIGS. 9A and 9B, a wire 130 that connects a gate 125 to another gate 126 via a crossbar switch circuit 127 has a defect 128. The defect 128 is a resistive path to ground. When the gate 125 is configured as a driving gate and the gate 126 is configured as a receiving gate (see FIG. 9A), the defect 128 may not be detected. This is due to the fact that the defect 128 is connected to the driving gate 125 through low resistance wire so the effect of the signal from the driving gate 125 at node 129 is much more significant than the effect of the defect 128.

However, when the gate 126 is configured as a driving gate and the gate 125 is configured as a receiving gate (see FIG. 9B), the defect will be observed. In this case, the signal from the driving gate 126 passes through significant resistance in the crossbar switch circuit 127 and thus, has a less significant effect at node 129 than the defect 128. Hence, the value observed at the receiving gate 125 is due to the defect 128, not the driving gate 126.

Figure 11:
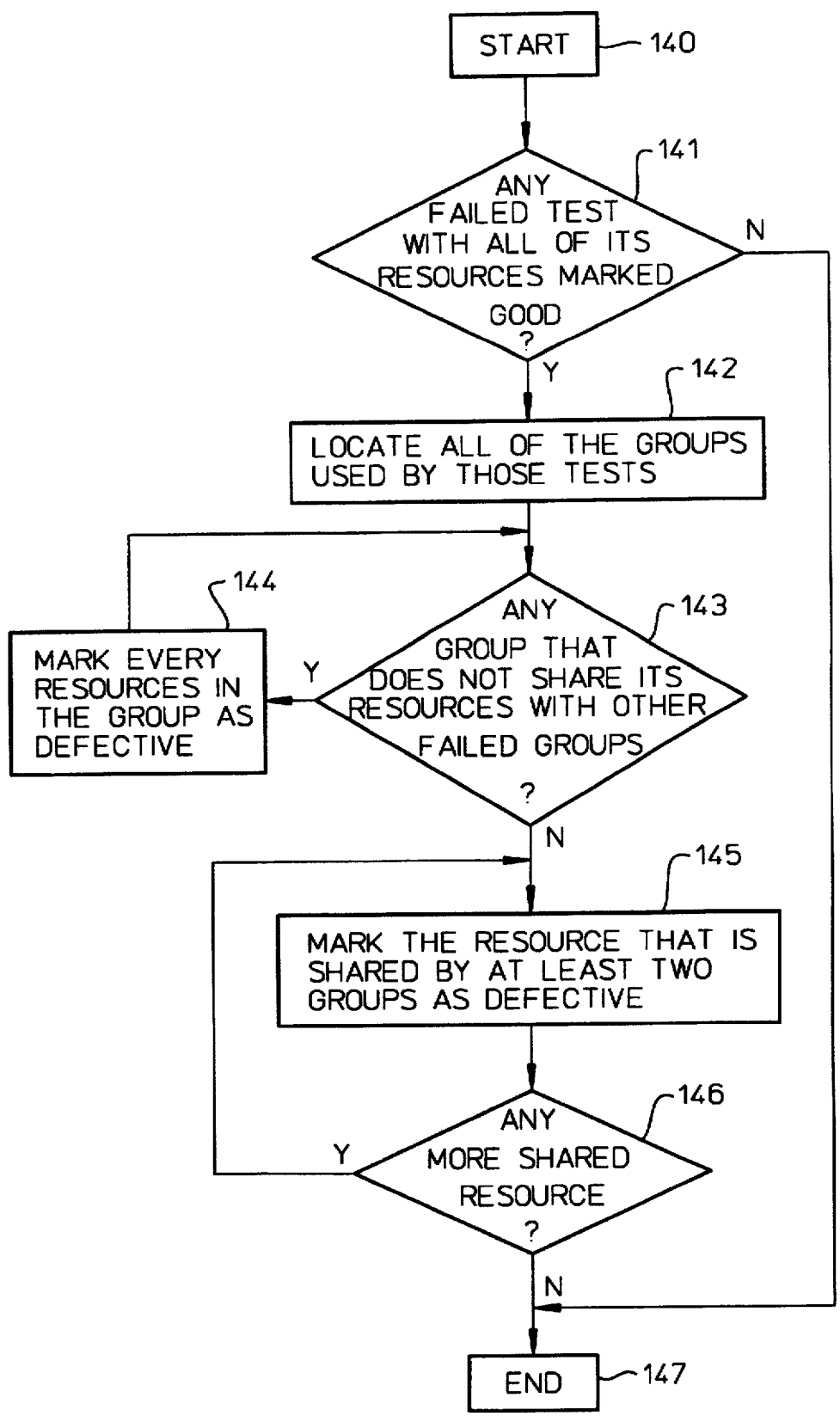
FIG. 11 shows the process of locating such defective resource shown in FIGS. 9A–10.

In order to detect such weak defects, the defect detection subsystem 33 (FIG. 2) locates the shared resources of any two or more than two failed random generators (preferably more than two) with each of the resources identified or marked as non-defective. The defect detection subsystem 33 then marks or identifies the shared resource as defective. The more failed random number generators that share a single resource, the more convincing it becomes that the shared resource is indeed a defective one. For example and as can be seen from FIG. 10, when the resource 136 is a weakly defective resource, it may function correctly in the random number generator 135 and be marked as a good resource. However, when the weak defective resource 136 is configured with other good resources to form random number generators 133 and 134, these two random number generators 133 and 134 may fail even though each of the resources in each of the two random number generators 133 and 134 has been marked good. In this case, the resource 136 is marked or remarked from non-defective to defective by the defect detection subsystem 33 because it is shared by the failed random number generators 133 and 134. FIG. 11 shows the process of detecting such weakly defective resource in accordance with one embodiment of the present invention, which is described in more detail below.

Referring to FIG. 11, step 141 is employed to determine if the reconfigurable system 10 FIGS. 1 and 2 contains any failed random number generator that has all of its resources marked as non-defective. If so, step 142 is performed. If not, the process ends at step 147. At step 142, each of the failed random number generators that has all of its resources marked as non-defective or good is located. Then step 143 is performed to determine if there is any failed generator that does not share its resources with any other failed random number generator. If so, step 144 is performed to mark or remark every resource in the generator as defective. If not, the step 144 is skipped. At step 145, the shared resource or resources by at least two failed generators are identified or marked as defective. The process then ends at step 147 via step 146.

Referring back to FIGS. 1 and 2, because the resources within the reconfigurable system 10 may also include crossbar switches and because the switches have significant and predicable resistance, the defect detection subsystem 33 (FIG. 2) can use those crossbar switches to detect if a connected driver (or buffer) is a healthy (i.e., non-defective) one or a defective one (i.e., whether the driver is a weak driver). In accordance with one embodiment, the defect detection subsystem 33 configures several crossbar switches of the reconfigurable system 10 in series as a resistor ladder to test the driving capability of a driver connected. This embodiment is described in more detail below, also in conjunction with FIGS. 12A through 12C.

Figure 12A:
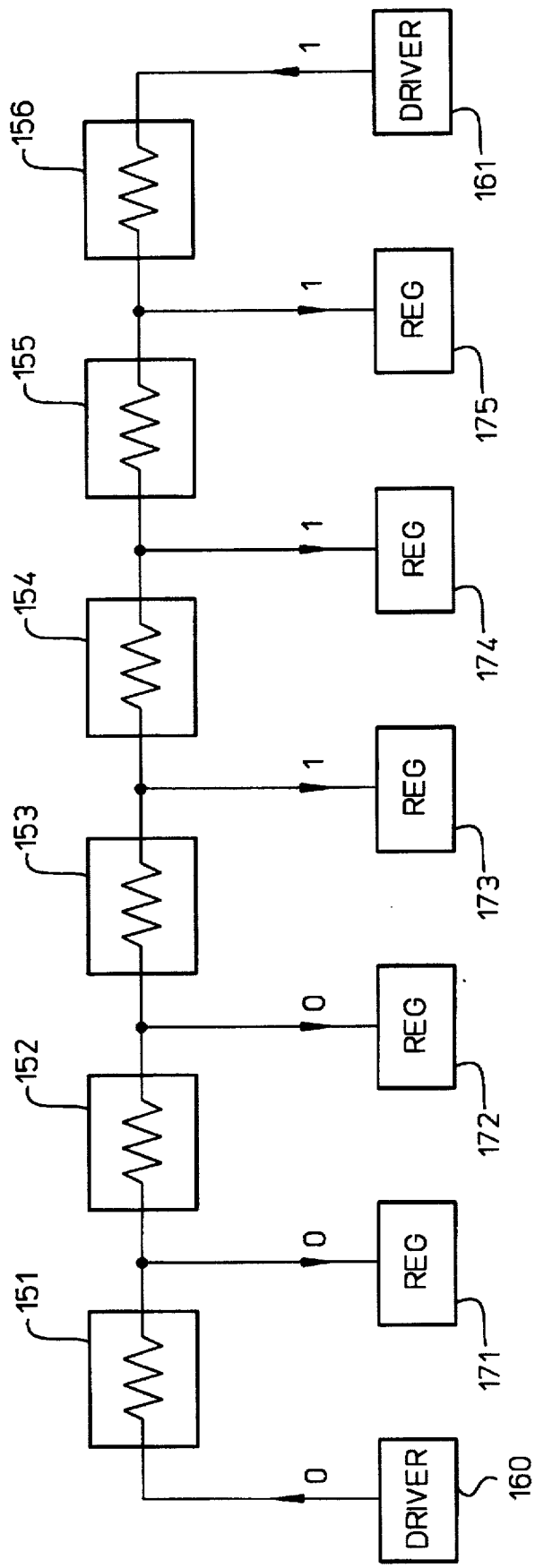
FIGS. 12A–12C show another method of detecting defective resources in the reconfigurable system.

As can be seen from FIG. 12A, switches 151 through 156 form a resistor ladder and two drivers (i.e., drivers 160 and 161) are connected at the two ends of the resistor ladder. Assume switches 151–156 are enough number of switches in series for safely driving one end of the resistor ladder with a logical low value and the other end of the resistor ladder with a logical high value. However, it is to be understood that in practice, many more switches are needed to connect between the two drivers in order to produce the test result more accurately. When the two drivers 160 and 161 are healthy (i.e., non-defective) drivers, a pattern of logical low and high values along the resistor ladder can be obtained. FIG. 12A shows one example of the pattern when the driver 160 and 161 are both non-defective.

Figure 12B:
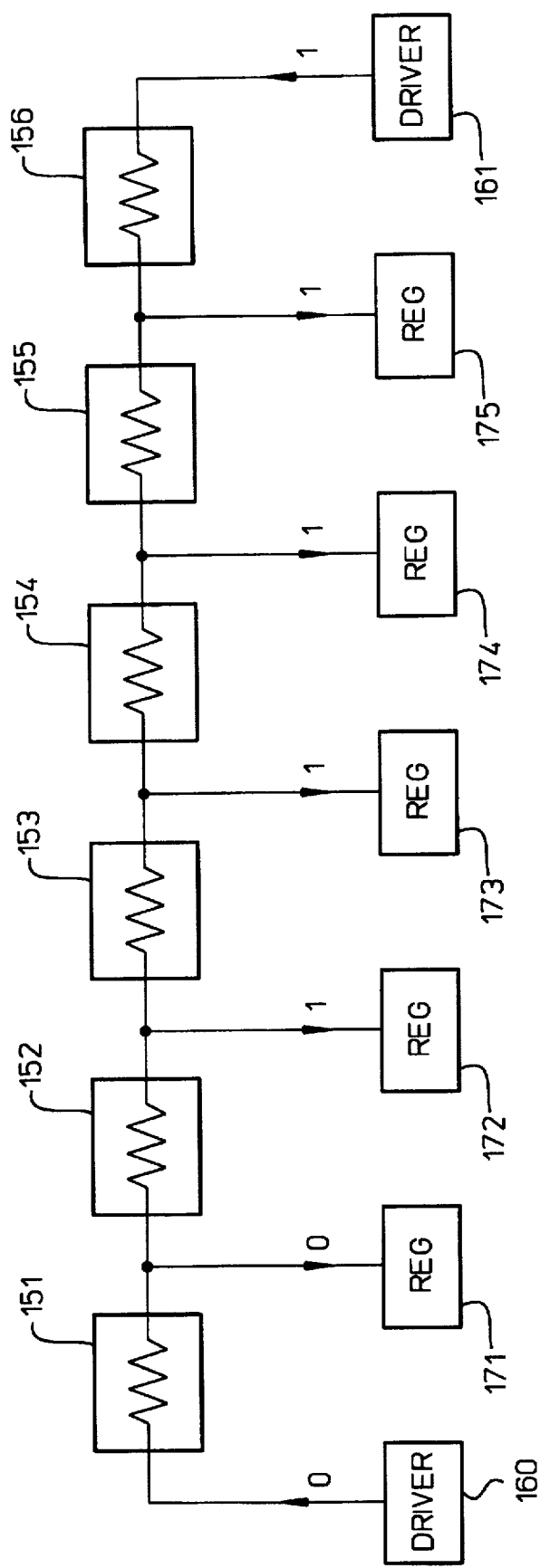
Figure 12C:
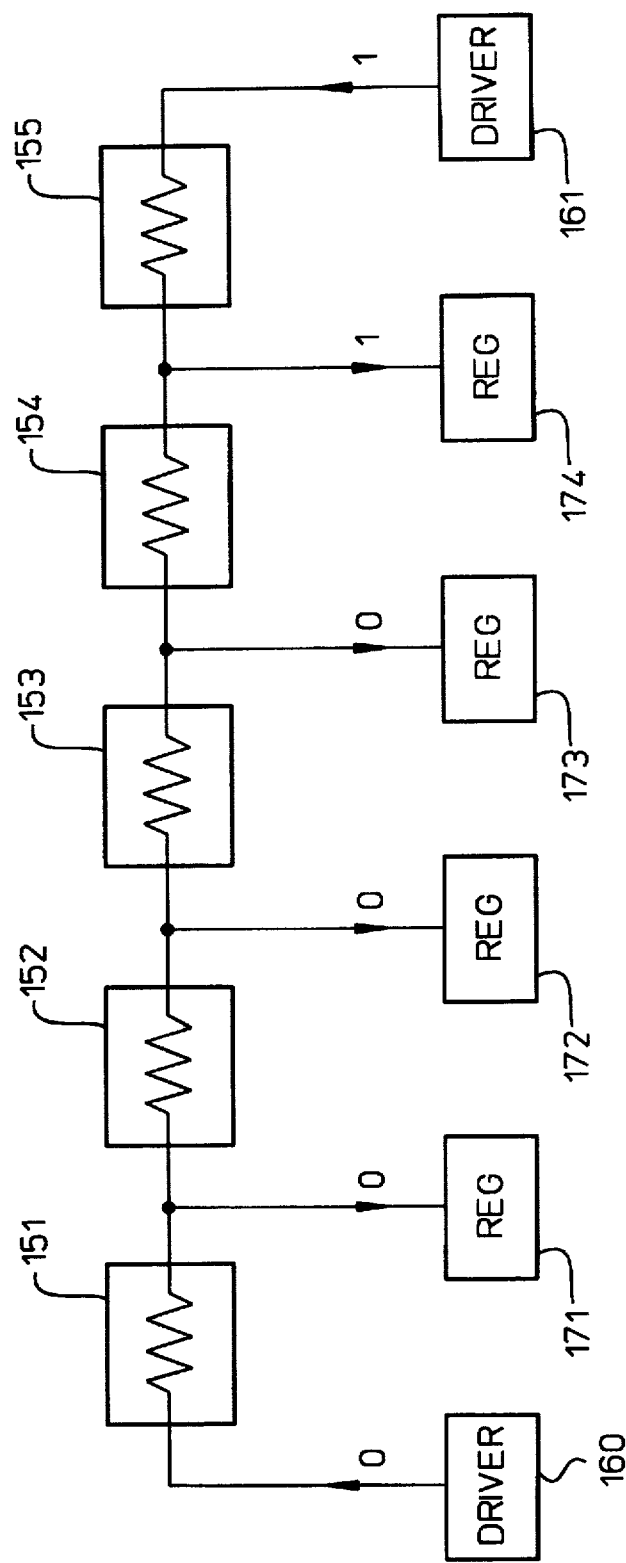

When, for example, one of the drivers 160 and 161 is a weak driver, the transition between the logical low and high values along the resistor ladder is shifted towards the weak driver, as shown in FIGS. 12B and 12C. As can be seen in FIG. 12B, the pattern of the logical high and low values along the resistor ladder indicates that the driver 160 is a weak driver. In FIG. 12C, the transition between the logical high and low values along the resistor ladder indicates that the driver 161 is a weak driver.

Referring back to FIG. 2, the defect detection subsystem 33 also detects signal delay of a resource of the reconfigurable system 10 in accordance with one embodiment of the present invention. The delay through a single resource typically is too low to measure directly. Hence, by using the following method, the delay can be determined. The defect detection subsystem 33 configures a number of resources in series into a test group or system and measures the total signal delay of the test system. The number of resources include the resource the signal delay of which is to be determined (i.e., the measured resource). The defect detection subsystem 33 then configures the same resources except the measured resource into a test system and measures the signal delay of that test system. The signal delay of the measured resource is then obtained by subtracting the signal delay of the first above-identified test system from that of the second above-identified test system.

Figure 13:
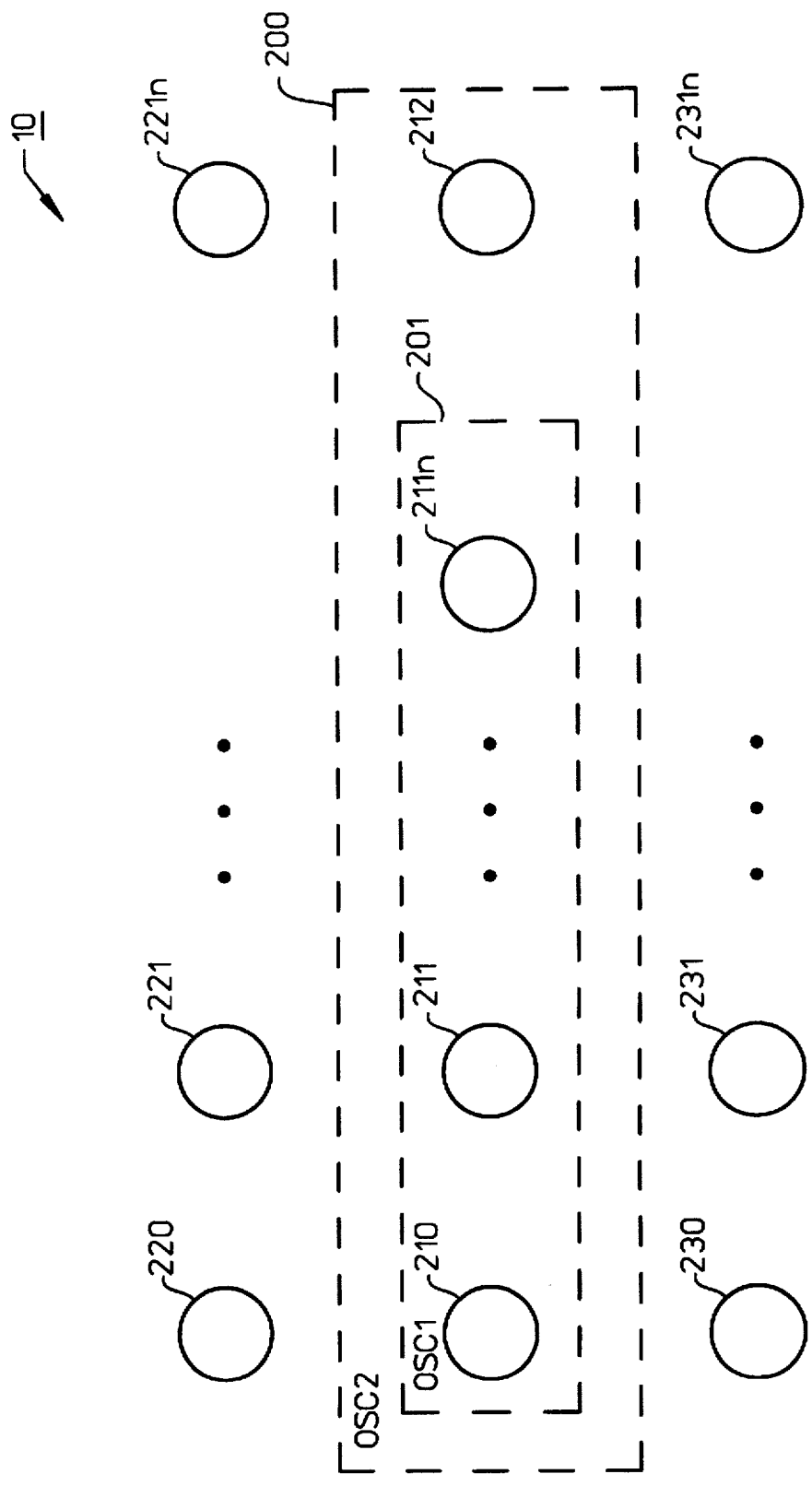
FIG. 13 shows the process of determining signal delay of a resource within the reconfigurable system of FIG. 1.

In one embodiment, the test group or system is an oscillator and the signal delay of the test system is obtained by measuring the frequency (f) of the oscillator. The signal delay of the oscillator is 1/f. FIG. 13 shows how the defect detection subsystem 33 of FIG. 2 configures some of the resources of the reconfigurable system 10 into oscillators to measure the signal delay of a resource, which will be described in more detail below.

As can be seen from FIG. 13, in order for the signal delay of a resource (e.g., the resource 212) of the reconfigurable system 10 to be determined, an oscillator 200 is configured using the resources 210 through 211n and 212 of the reconfigurable system 10. Then a frequency counter (not shown in FIG. 13) is also configured using some other resources of the reconfigurable system 10 to measure the frequency $f_1$, of the oscillator 200. Alternatively, an external frequency counter can be used. Once the frequency f, of the oscillator 200 is determined, the defect detection system 33 of FIG. 2 builds a second oscillator (i.e., oscillator 201) using the same resources of the oscillator 200 except the resource 212. This means that the second oscillator 201 is built using the resources 210–211n. Then the frequency $f_2$ of the second oscillator 201 is determined by the frequency counter. The signal delay of the resource 212 is then determined by $1/f_1-1/f_2$ (i.e., the difference in the periods of the two oscillators 200 and 201 is the delay through the resource 212). Because the frequency counter can be run for an arbitrary long period of time, extremely accurate delay measurements can be obtained.

In the foregoing specification, the invention has been described with reference to specific embodiments thereof It will, however, be evident to those skilled in the art that various modifications and changes may be made thereto without departing from the broader spirit and scope of the invention. Therefore, the invention is not limited to the specific embodiments described and illustrated.

What is claimed is:

1. In a reconfigurable electronic system having a plurality of resources, a method of detecting if the resources contain at least one defective resource, comprising the steps of:
   (A) assuming each of the resources is defective;
   (B) configuring the resources into a number of test systems, each having a number of the resources;
   (C) determining if each of the test systems is operational;
   (D) identifying each resource within each of the test systems determined to be operational as non-defective;
   (E) reconfiguring the resources into a number of different test systems and repeating the steps (C) and (D) until substantially every one of the resources except the defective resource has been identified as non-defective.

2. The method of claim 1, further comprising the step of storing data of the defective resource into a defect database such that when the resources are configured by a compiler to implement a functional system, the defective resource is not used in the functional system.

3. The method of claim 2, further comprising the step of storing in the defect database a unique identification value that associates the defect database with the reconfigurable system.

4. The method of claim 1, wherein each of the resources can be one of an integrated circuit (IC) element, a group of IC elements, a wire connection, a set of wire connections, and a combination of IC elements and wire connections.

5. The method of claim 1, wherein the step (C) further comprises the steps of
   (I) determining which of the test systems is non-operational;
   (II) determining which of a number of sub-circuits within the non-operational test system is operational, wherein each of the sub-circuits includes a number of resources;
   (III) identifying each of the number of resources within the operational sub-circuit as non-defective.

6. The method of claim 1, wherein each of the test systems is a random number generator that, if operational, generates a predetermined output number based on a predetermined input number, wherein the step (C) further comprises the steps of
   (a) sending the predetermined input number to the random number generator;
   (b) comparing the predetermined output number with an actual output number of the random number generator;
   (c) determining that the random number generator is non-operational if the predetermined output number does not match the actual output number.

7. The method of claim 6, wherein the step (C) further comprises the steps of:
   (d) determining which bit of the actual output number matches the corresponding bit of the predetermined output number;
   (e) identifying as non-defective the corresponding resource of the bit of the actual output number that matches the corresponding bit of the predetermined output number.

8. A method of determining defective resources among a plurality of resources of a reconfigurable electronic system, comprising the steps of:
   (A) assuming each of the plurality of resource is defective;
   (B) locating (1) a first test group having a first number of the resources that has been tested non-operational and (2) a second test group having a second number of the resources that has been tested non-operational;
   (C) determining which of the first and second numbers of the resources is a shared resource by the first and second test groups;
   (D) identifying the shared resource as an actually defective resource.

9. The method of claim 8, wherein each of the first and second numbers of the resources has been tested and identified as non-defective.

10. The method of claim 8, further comprising the steps of
    (I) storing data of the defective resource into a defect database such that when the resources are configured by a compiler to implement a functional system, the defective resource is not used in the functional system;
    (II) storing in the defect database a unique identification value that associates the defect database with the reconfigurable system.

11. The method of claim 8, wherein each of the resources can be one of an integrated circuit (IC) element, a group of IC elements, a wire connection, a set of wire connections, and a combination of IC elements and wire connections.

12. An apparatus, comprising:
    (A) a storage medium;

(B) a computer executable program stored on the storage medium that, when executed, detects if a plurality of resources in a reconfigurable system contain at least one defective resource, the computer executable program further comprising
 (a) first set of instructions that assume each of the resources is defective;
 (b) a second set of instructions that configure the resources into a number of test systems, each having a number of the resources;
 (c) a third set of instructions that determine if each of the test systems is operational;
 (d) a fourth set of instructions that identify each resource within each of the test systems determined to be operational as non-defective;
 (e) a fifth set of instructions that reconfigure the resources into a number of different test systems and repeat the third and fourth sets of instructions until substantially every one of the resources except the defective resource has been identified as non-defective.

13. The apparatus of claim 12, further comprising
 (I) a sixth set of instructions that create a defect database to store data of the defective resource such that when the resources are configured by a compiler to implement a functional system, the defective resource is not used in the functional system;
 (II) a seventh set of instructions that store in the defect database a unique identification value that associates the defect database with the reconfigurable system.

14. The apparatus of claim 12, wherein each of the resources can be one of an integrated circuit (IC) element, a group of IC elements, a wire connection, a set of wire connections, and a combination of IC elements and wire connections.

15. The apparatus of claim 12, wherein each of the test systems is a random number generator that, if operational, generates a predetermined output number based on a predetermined input number, wherein the third set of instructions further comprises
 (i) a first subset of instructions that send the predetermined input number to the random number generator;
 (ii) a second subset of instructions that compare the predetermined output number with an actual output number of the random number generator;
 (iii) a third subset of instructions that determine the random number generator is non-operational if the predetermined output number does not match the actual output number.

16. The apparatus of claim 15, wherein the third set of instructions further comprises
 (iv) a fourth subset of instructions that determine which bit of the actual output number matches the corresponding bit of the predetermined output number;
 (v) a fifth subset of instructions that mark as non-defective the corresponding resources of the bit of the actual output number that matches the corresponding bit of the predetermined output number.

17. An apparatus, comprising:
 (A) a storage medium;
 (B) a computer executable program stored on the storage medium that, when executed, determines defective resources among a plurality of resources of a reconfigurable system, wherein each of the plurality of resources is initially assumed to be defective, the computer executable program comprising
 (a) a first set of instructions that locate (1) a first test group having a first number of the resources that has been tested non-operational and (2) a second test group having a second number of the resources that has been tested non-operational;
 (b) a second set of instructions that determine which of the first and second numbers of the resources is a shared resource by the first and second test groups;
 (c) a third set of instructions that identify the shared resource as an actually defective resource.

18. The apparatus of claim 17, wherein each of the first and second numbers of the resources has been tested and identified as non-defective.

19. The apparatus of claim 17, wherein each of the resources can be one of an integrated circuit (IC) element, a group of IC elements, a wire connection, a set of wire connections, and a combination of IC elements and wire connections.

* * * * *